(12) United States Patent
Campbell et al.

(10) Patent No.: US 7,751,918 B2
(45) Date of Patent: Jul. 6, 2010

(54) METHODS FOR CONFIGURING TUBING FOR INTERCONNECTING IN-SERIES MULTIPLE LIQUID-COOLED COLD PLATES

(75) Inventors: Levi A. Campbell, Poughkeepsie, NY (US); John L. Colbert, Byron, MN (US); Michael J. Ellsworth, Jr., Lagrangeville, NY (US); Arvind K. Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 771 days.

(21) Appl. No.: 11/620,088

(22) Filed: Jan. 5, 2007

(65) Prior Publication Data
US 2008/0163631 A1 Jul. 10, 2008

(51) Int. Cl.
*G06F 19/00* (2006.01)
*F25B 7/00* (2006.01)
*H01G 4/002* (2006.01)
*H02B 1/00* (2006.01)

(52) U.S. Cl. .................. 700/97; 62/175; 361/274.2; 361/676

(58) Field of Classification Search .............. 700/97; 361/274.2, 676, 679.41, 688–699, 701–702; 165/80.4, 104.33
See application file for complete search history.

(56) References Cited

U.S. PATENT DOCUMENTS

| | | | |
|---|---|---|---|
| 4,748,495 | A | 5/1988 | Kucharek |
| 4,771,366 | A | 9/1988 | Blake et al. |

(Continued)

FOREIGN PATENT DOCUMENTS

EP 1059665 12/2000

(Continued)

OTHER PUBLICATIONS

Campbell et al., "Hybrid Cooling System and Method for a Multi-Component Electronics System", U.S. Appl. No. 11/539,902, filed Oct. 10, 2006.

(Continued)

*Primary Examiner*—Albert DeCady
*Assistant Examiner*—Jason Lin
(74) *Attorney, Agent, or Firm*—Geraldine Monteleone, Esq.; Kevin P. Radigan, Esq.; Heslin Rothenberg Farley & Mesiti P.C.

(57) ABSTRACT

Methods of configuring a cooling subassembly for an electronics system are provided, that is, for establishing a coolant-carrying tube layout for interconnecting multiple liquid-cooled cold plates in series-fluid communication for cooling multiple heat-generating electronic components of an electronics system. The electronic components are to be plugged in fixed relation into a preconfigured motherboard, and the tube layout includes at least one rigid coolant-carrying tube. Simplified analysis is initially performed to evaluate stress on the rigid tube(s) and determine if loss of actuation load on the electronic components exceeds an acceptable threshold, and if so, at least one tube having high stress is identified and reconfigured. Thereafter, analysis is performed to determine whether, with available actuation load on the cooling subassembly, electrical connection loading between the electronic components and the supporting motherboard is above an acceptable minimum level. If so, the coolant-carrying tube layout is chosen as a final design.

20 Claims, 21 Drawing Sheets

U.S. PATENT DOCUMENTS

| | | |
|---|---|---|
| 4,884,168 A | 11/1989 | August et al. |
| 5,305,185 A | 4/1994 | Samarov et al. |
| 5,323,847 A | 6/1994 | Koizumi et al. |
| 5,428,897 A | 7/1995 | Jordan et al. |
| 5,730,620 A | 3/1998 | Chan et al. |
| 5,738,531 A | 4/1998 | Beaman et al. |
| 5,770,891 A | 6/1998 | Frankeny et al. |
| 5,801,924 A * | 9/1998 | Salmonson ................. 361/719 |
| 5,870,286 A | 2/1999 | Butterbaugh et al. |
| 5,901,039 A | 5/1999 | Dehaine et al. |
| 5,932,925 A | 8/1999 | McIntyre |
| 5,978,223 A | 11/1999 | Hamilton et al. |
| 6,023,413 A | 2/2000 | Umezawa |
| 6,108,899 A | 8/2000 | Piccirilli |
| 6,122,167 A * | 9/2000 | Smith et al. ............. 361/679.47 |
| 6,198,630 B1 | 3/2001 | Cromwell |
| 6,261,404 B1 | 7/2001 | Baska et al. |
| 6,330,745 B1 | 12/2001 | Cromwell et al. |
| 6,385,044 B1 | 5/2002 | Colbert et al. |
| 6,386,890 B1 | 5/2002 | Bhatt et al. |
| 6,415,853 B1 | 7/2002 | Tao et al. |
| 6,437,980 B1 | 8/2002 | Casebolt |
| 6,442,026 B2 | 8/2002 | Yamaoka |
| 6,449,155 B1 | 9/2002 | Colbert et al. |
| 6,449,162 B1 | 9/2002 | Corbin, Jr. et al. |
| 6,475,011 B1 | 11/2002 | Sinha et al. |
| 6,557,675 B2 | 5/2003 | Iannuzzelli |
| 6,587,343 B2 | 7/2003 | Novotny et al. |
| 6,639,800 B1 | 10/2003 | Eyman et al. |
| 6,724,629 B1 | 4/2004 | Augustin et al. |
| 6,746,270 B2 | 6/2004 | Peterson et al. |
| 6,748,656 B2 | 6/2004 | Woerner et al. |
| 6,757,965 B2 | 7/2004 | Colbert et al. |
| 6,789,312 B2 | 9/2004 | White |
| 6,802,733 B2 | 10/2004 | Colbert et al. |
| 6,835,072 B2 | 12/2004 | Simons et al. |
| 6,836,408 B2 | 12/2004 | Getkin et al. |
| 6,898,083 B1 | 5/2005 | Hornung |
| 6,930,884 B2 | 8/2005 | Cromwell et al. |
| 6,950,310 B2 | 9/2005 | Edwards |
| 6,967,841 B1 | 11/2005 | Chu et al. |
| 6,967,842 B2 | 11/2005 | Aoki et al. |
| 6,970,355 B2 | 11/2005 | Ellsworth et al. |
| 6,986,191 B2 | 1/2006 | White |
| 6,988,533 B2 | 1/2006 | Colbert et al. |
| 7,011,143 B2 | 3/2006 | Corrado et al. |
| 7,012,807 B2 * | 3/2006 | Chu et al. ................... 361/699 |
| 7,068,510 B2 | 6/2006 | Crippen et al. |
| 7,095,614 B2 | 8/2006 | Goldman |
| 7,187,549 B2 | 3/2007 | Teneketges et al. |
| 7,203,063 B2 * | 4/2007 | Bash et al. .................. 361/699 |
| 7,252,139 B2 | 8/2007 | Novotny et al. |
| 7,272,006 B2 | 9/2007 | Mongia et al. |
| 7,280,363 B2 | 10/2007 | Reyzin et al. |
| 7,283,368 B2 | 10/2007 | Wung et al. |
| 7,323,358 B1 | 1/2008 | Cromwell |
| 7,325,588 B2 * | 2/2008 | Malone et al. ............. 165/80.2 |
| 7,327,573 B2 | 2/2008 | Lee et al. |
| 7,345,881 B2 | 3/2008 | Colbert et al. |
| 7,380,409 B2 | 6/2008 | Campbell et al. |
| 7,382,620 B2 | 6/2008 | Khanna et al. |
| 7,408,776 B2 * | 8/2008 | Campbell et al. ........... 361/699 |
| 7,417,864 B2 | 8/2008 | Barsun et al. |
| 7,486,516 B2 | 2/2009 | Colbert et al. |
| 7,606,033 B2 | 10/2009 | Colbert et al. |
| 2002/0060064 A1 | 5/2002 | Yu |
| 2004/0095721 A1* | 5/2004 | Ellsworth et al. ........... 361/694 |
| 2004/0221604 A1* | 11/2004 | Ota et al. ................... 62/259.2 |
| 2004/0247925 A1 | 12/2004 | Cromwell |
| 2007/0125523 A1 | 6/2007 | Bhatti et al. |
| 2007/0125524 A1* | 6/2007 | Zoodsma ............... 165/104.33 |
| 2008/0024991 A1* | 1/2008 | Colbert et al. .............. 361/704 |
| 2008/0081489 A1 | 4/2008 | MacGregor et al. |
| 2008/0264603 A1 | 10/2008 | Colbert et al. |

FOREIGN PATENT DOCUMENTS

| | | |
|---|---|---|
| WO | 9810631 | 3/1998 |
| WO | 9835540 | 8/1998 |

OTHER PUBLICATIONS

Campbell et al., "Conductive Heat Transport Cooling System and Method for a Multi-Component Electronics System", U.S. Appl. No. 11/539,905, filed Oct. 10, 2006.

Campbell et al., "Method of Assembling a Cooling System for a Multi-Component Electronics System", U.S. Appl. No. 11/539,907, filed Oct. 10, 2006.

Campbell et al., "Liquid-Based Cooling System for Cooling a Multi-Component Electronics System", U.S. Appl. No. 11/539,910, filed Oct. 10, 2006.

Colbert et al., "Heatsink Apparatus for Applying a Specified Compressive Force to an Integrated Circuit Device", U.S. Appl. No. 11/460,334, filed Jul. 27, 2006.

Colbert et al., "Method and Apparatus for Mounting a Heat Sink in Thermal Contact with an Electronic Component", U.S. Appl. No. 11/201,972, filed Aug. 11, 2005.

* cited by examiner

METHODS FOR CONFIGURING TUBING FOR INTERCONNECTING IN-SERIES MULTIPLE LIQUID-COOLED COLD PLATES

CROSS-REFERENCE TO RELATED APPLICATIONS

This application contains subject matter which is related to the subject matter of the following applications, each of which is assigned to the same assignee as this application and each of which is hereby incorporated herein by reference in its entirety:

"Hybrid Cooling System and Method for a Multi-Component Electronics System", Campbell et al., U.S. Pat. No. 7,400,505, issued Jul. 15, 2008;

"Conductive Heat Transport Cooling System and Method for a Multi-Component Electronics System", Campbell et al., U.S. Pat. No. 7,408,776, issued Aug. 5, 2008;

"Method of Assembling a Cooling System for a Multi-Component Electronics System", Campbell et al, U.S. Pat. No. 7,641,101, issued Jan. 5, 2010;

"Liquid-Based Cooling System for Cooling a Multi-Component Electronics System", Campbell et al., U.S. Pat. No. 7,420,808, issued Sep. 2, 2008;

"Heatsink Apparatus for Applying a Specified Compressive Force to an Integrated Circuit Device", Colbert et al, U.S. Patent Publication No. 2008/0024991, published Jan. 31, 2008; and "Method and Apparatus for Mounting a Heat Sink in Thermal Contact with an Electronic Component", Colbert et al, U.S. Pat. No. 7,486,516, issued Feb. 3, 2009.

TECHNICAL FIELD

The present invention relates in general to cooling an electronics system, and more particularly, to a liquid-based cooling system for cooling a multi-component electronics system. Still more particularly, the present invention relates to methods for configuring a cooling-carrying tube layout for interconnecting in-series multiple liquid-cooled cold plates of a liquid-based cooling system for cooling a multi-component electronics system.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of air exhausted into the computer center.

In many large server applications, processors along with their associated electronics (e.g., memory, disk drives, power, etc.), are packaged in removable drawer configurations stacked or aligned within a rack or frame. In other cases, the electronics may be in fixed locations within the rack or frame. Typically, the components are cooled by air moving in parallel air flow paths, usually front-to-back, impelled by one or more air moving devices (e.g., fans or blowers). In some cases it may be possible to handle increased power dissipation within a single drawer by providing greater air flow, for example, through the use of a more powerful air moving device or by increasing the rotational speed (i.e., RPMs) of an existing air moving device. However, this approach is becoming unmanageable at the frame level in the context of a computer installation (e.g., data center).

The sensible heat load carried by the air exiting the frame will eventually exceed the ability of room air conditioning to effectively handle the load. This is especially true for large installations of "server farms" or large banks of computer frames close together. In such installations, not only will the room air conditioning be challenged, but the situation may also result in recirculation problems with some fraction of the "hot" air exiting one frame being drawn into the air inlet of the same or a nearby frame. Furthermore, while the acoustic noise level of a powerful (or higher RPM) air moving device in a single drawer may be within acceptable acoustic limits, because of the number of air moving devices in the frame, the total acoustic noise at the frame level may not be acceptable. In addition, the conventional openings in the frame for the entry and exit of air flow make it difficult, if not impossible to provide effective acoustic treatment to reduce the acoustic noise level outside the frame. Finally, as operating frequencies continue to increase, electromagnetic cross talk between tightly spaced computer frames is becoming a problem largely due to the presence of the openings in the covers.

Accordingly, there is a significant need for enhanced cooling mechanisms for electronic components, individually and at all levels of packaging, including for example, rack-mounted or blade-mounted electronic components of various large computer systems today.

SUMMARY OF THE INVENTION

The need to cool current and future high heat load, high heat flux electronic components requires development of aggressive thermal management techniques, such as liquid-based cooling systems and methods of fabrication. The concepts disclosed herein address the need for enhanced liquid-based cooling systems for facilitating cooling of a multi-component electronics system, as well as the need for enhanced methods of fabricating liquid-based cooling systems.

Briefly summarized, the present invention comprises in one aspect a method which includes: obtaining a coolant-carrying tube layout for interconnecting multiple liquid-cooled cold plates in series-fluid communication for cooling multiple heat-generating electronic components of an electronics system, the interconnected multiple liquid-cooled cold plates being a cooling subassembly, the multiple heat-generating electronic components to be plugged in fixed spaced relation into corresponding sockets on a supporting motherboard, and the coolant-carrying tube layout comprising at least one rigid coolant-carrying tube; determining for the coolant-carrying tube layout if stress in one or more rigid coolant-carrying tubes thereof exceeds a predetermined acceptable level, and determining if loss of actuation load on a heat-generating electronic component being cooled by the cooling subassembly exceeds an acceptable loss threshold, and if either is true, identifying at least one tube of the coolant-carrying tube layout having high stress, the at least one tube comprising at least one of a tube portion in torsion and a tube portion in bending when a force is applied to at least one liquid-cooled cold plate of the cooling subassembly, and reconfiguring the at least one tube having high stress to produce a reconfigured coolant-carrying tube layout and repeating the determining for the reconfigured coolant-carrying tube layout; performing analysis on the cooling subassembly and the multiple heat-generating electronic components of the electronics system once the coolant-carrying tube layout experiences tube stress below the defined acceptable level and a loss of actuation load on the multiple heat-generating electronic components below the acceptable loss threshold, the analysis including employing the available actuation load on at least part of the cooling subassembly and evaluating electrical connection loading between at least one heat-generating electronic component being cooled thereby and the supporting motherboard into which the heat-generating electronic components electrically connect in fixed spaced relation; and saving the coolant-carrying tube layout as a final design for interconnecting in series-fluid communication the multiple liquid-cooled cold plates of the cooling subassembly if the electrical connection loading is above an acceptable minimum level.

In a further aspect, a method of configuring a cooling subassembly for an electronics system is provided. This method includes: obtaining a coolant-carrying tube layout for interconnecting multiple liquid-cooled cold plates in series-fluid communication for cooling multiple heat-generating electronic components of an electronics system, the interconnected multiple liquid-cooled cold plates being a cooling subassembly, the multiple heat-generating electronic components to be plugged in fixed spaced relation into corresponding sockets on a preconfigured supporting motherboard, and the coolant-carrying tube layout comprising at least one rigid coolant-carrying tube; performing simplified three-dimensional numerical analysis of stress and strain on the cooling subassembly to determine for the coolant-carrying tube layout stress on at least one coolant-carrying tube interconnecting at least two liquid-cooled cold plates of the multiple liquid-cooled cold plates and loss of actuation load on at least one heat-generating electronic component of the multiple heat-generating electronic components resulting from the coolant-carrying tube layout, the simplified three-dimensional numerical analysis of stress and strain being performed without evaluating the electrical connection loading of the multiple heat-generating electronic components into the supporting motherboard employing an available actuation load; determining for the coolant-carrying layout if stress in the at least one coolant-carrying tube exceeds a predefined acceptable level and determining if loss of actuation load on the at least one heat-generating electronic component exceeds an acceptable loss threshold, and if either is true, reconfiguring the coolant-carrying tube layout until stress in the at least one coolant-carrying tube interconnecting the at least two liquid-cooled cold plates is below the predefined acceptable level and the loss of actuation load on the at least one heat-generating electronic component is below the acceptable loss threshold; performing detailed three-dimensional numerical analysis of stress and strain on the cooling subassembly and the multiple heat-generating electronic components of the electronics system once the coolant-carrying tube layout experiences tube stress below the acceptable level and loss of actuation load on the at least one heat-generating electronic component below the acceptable loss threshold, the detailed three-dimensional numerical analysis of stress and strain including employing the available actuation load on the cooling subassembly to evaluate electrical connection loading of the multiple heat-generating electronic components into the sockets on the supporting motherboard; and saving the coolant-carrying tube layout as a final design for interconnecting in series-fluid communication the multiple liquid-cooled cold plates of the cooling subassembly if the electrical connection loading is acceptable.

In a further aspect, a method of configuring a cooling subassembly for an electronics system is provided, which includes: ascertaining a configuration of an electronics system, the electronics system comprising a preconfigured supporting motherboard and a plurality of heat-generating electronic components to be cooled, the plurality of heat-generating electronic components to be cooled being electrically pluggable into corresponding sockets on the preconfigured motherboard; obtaining available actuation load for plugging the plurality of heat-generating electronic components into the corresponding sockets of the motherboard and a required final load on each electrical connection of the plurality of heat-generating electronic components into the motherboard; and providing a cooling subassembly employing the ascertained configuration of the electronics system, the cooling subassembly comprising a plurality of liquid-cooled cold plates. Providing of the cooling subassembly includes: laying out at least one cooling subassembly, the at least one cooling subassembly comprising at least two liquid-cooled cold plates of the plurality of liquid-cooled cold plates coupled in series-fluid communication for cooling at least two heat-generating electronic components of the plurality of heat-generating electronic components, the at least two liquid-cooled cold plates being coupled in series-fluid communication employing at least one rigid tube, wherein the laying out includes: selecting a configuration for the at least one rigid tube; and employing the available actuation load and required final load on each electrical connection to determine if loss of actuation load on a heat-generating electronic component to be cooled by one of the at least two liquid-cooled cold plates coupled in series-fluid communication is below an acceptable threshold, and if so, employing the selecting configuration for the at least one rigid tube in the at least one cooling subassembly, otherwise, reconfiguring the at least one rigid tube to reduce reactionary force resulting therefrom on at least one liquid-cooled cold plate of the at least two liquid-cooled cold plates coupled in series-fluid communication, the reconfiguring being repeated until loss of actuation load on the at least one liquid-cooled cold plate of the at least two liquid-cooled cold plates coupled in series-fluid communication is below the acceptable threshold.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein "electronics system" comprises any system containing one or more heat generating components of a computer system or other electronics unit requiring cooling. The terms "electronics rack", "electronics frame", and "frame" are used interchangeably, and include any housing, rack, compartment, blade chassis, etc., having heat generating components of a computer system or electronics system and may be for example, a stand-alone computer processor having high, mid or low end processing capability. In one embodiment, an electronics frame comprises multiple electronics drawers, each having multiple heat generating components disposed therein requiring cooling. "Electronics drawer" refers to any sub-housing, blade, book, drawer, node, compartment, etc., having multiple heat generating electronic components disposed therein. Each electronics drawer of an electronics frame may be movable or fixed relative to the electronics frame, with rack mounted electronics drawers and blades of a blade center system being two examples of drawers of an electronics frame to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. As used herein, "primary heat generating component" refers to a primary heat generating electronic component within the electronics system, while "secondary heat generating component" refers to an electronic component of the electronics system generating less heat than the primary heat generating component to be cooled. "Primary heat generating die" refers, for example, to a primary heat generating die or chip within a heat generating electronic component comprising primary and secondary heat generating dies (with a processor die being one example). "Secondary heat generating die" refers to a die of a multi-die electronic component generating less heat than the primary heat generating die thereof (with memory dies and memory support dies being examples of secondary dies to be cooled). As one example, a heat generating electronic component could comprise multiple primary heat generating bare dies and multiple secondary heat generating dies on a common carrier. Further, unless otherwise specified herein, the term "liquid-cooled cold plate" refers to any conventional thermally conductive structure having a plurality of channels or passageways formed therein for flowing of liquid coolant therethrough. In addition, "metallurgically bonded" refers generally herein to two components being welded, brazed or soldered together by any means.

Figure 1:
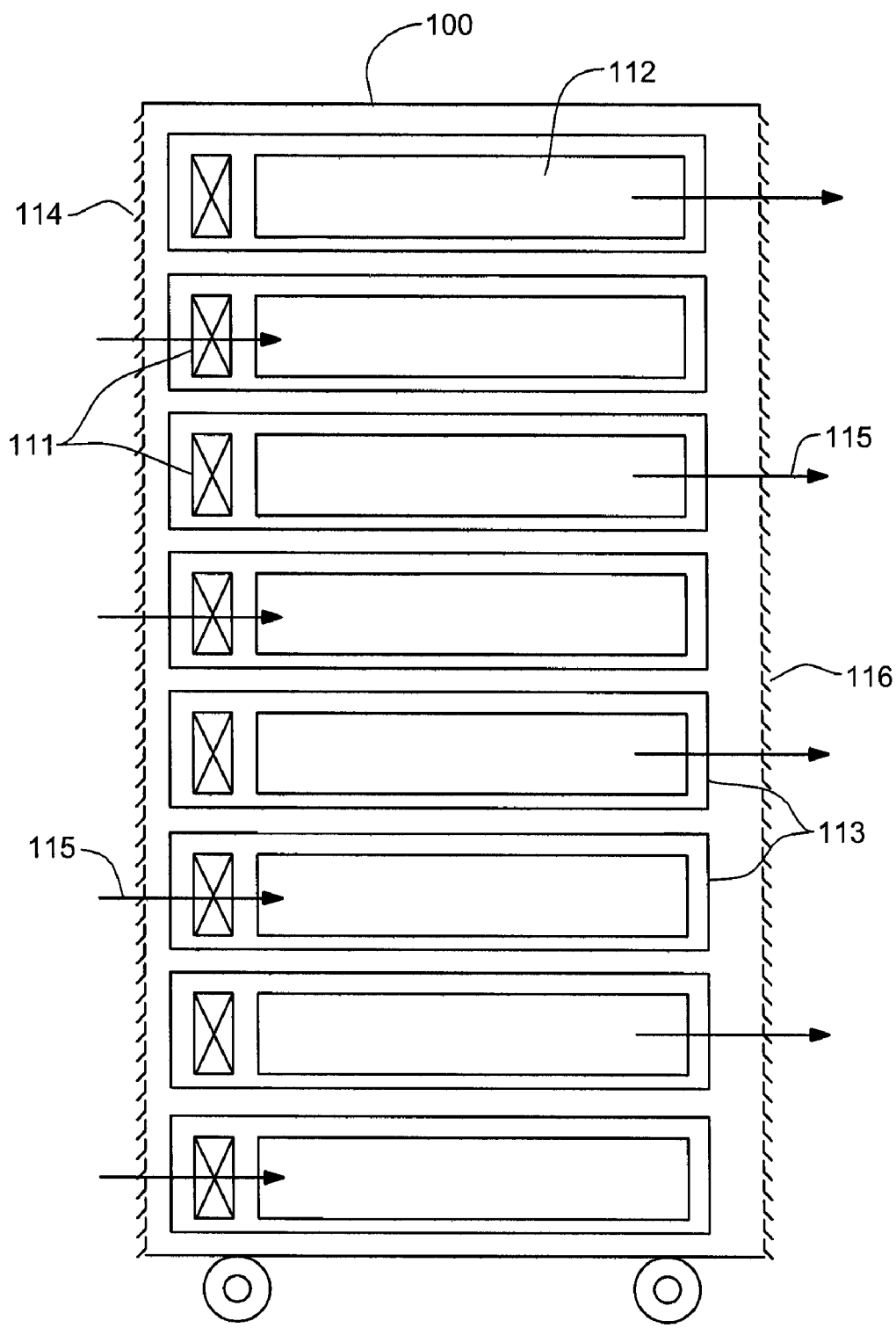
FIG. 1 depicts one embodiment of a conventional air-cooled electronics frame with heat generating electronic components disposed in removable electronics drawers.

As shown in FIG. 1, in rack-mounted configurations typical in the prior art, a plurality of air moving devices 111 (e.g., fans or blowers) provide forced air flow 115 needed to cool the electronic components 112 within the electronics drawers 113 of the frame 100. Cool air is taken in through a louvered inlet cover 114 in the front of the frame and exhausted out a louvered outlet cover 116 in the back of the frame.

Figure 2:
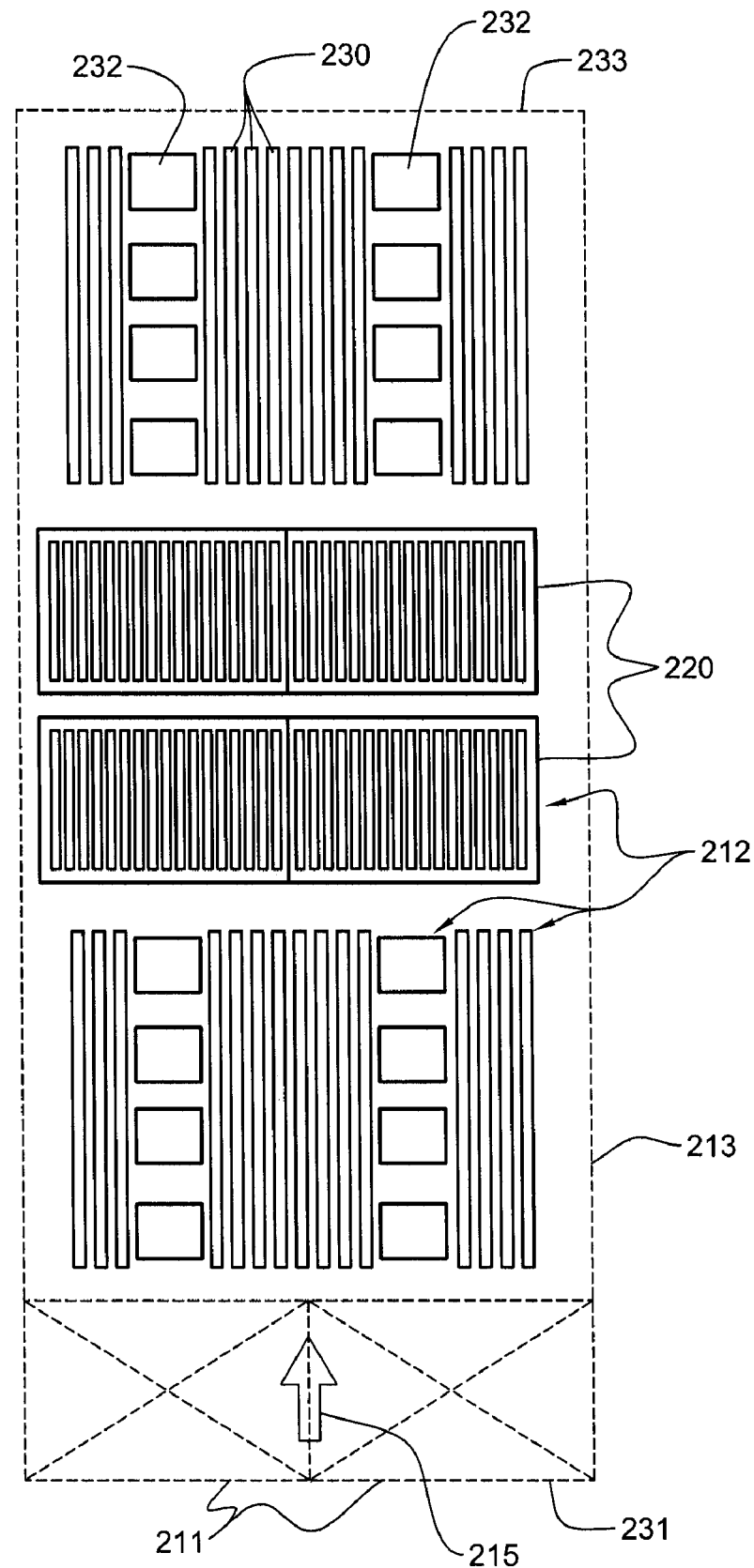
FIG. 2 is a plan view of one embodiment of an electronics drawer layout illustrating multiple electronic components to be cooled, in accordance with an aspect of the present invention.

FIG. 2 illustrates one embodiment of a multi-component electronics drawer 213 having a component layout in accordance with an aspect of the present invention. Electronics drawer 213 includes one or more air moving devices 211 (e.g., fans or blowers) which provide forced air flow 215 across the multiple electronic components 212 within electronics drawer 213. Cool air is taken in through a front 231 of electronics drawer 213 and exhausted out a back 233 of the electronics drawer. In this embodiment, the multiple electronic components to be cooled 212 include processor modules disposed below air-cooled heat sinks 220, as well as (by way of example) multiple rows of memory support modules 232 disposed between arrayed memory modules 230, such as air-cooled dual in-line memory module (DIMM) packages.

Electronic components are generally packaged using one or more electronic packages (i.e., modules) that include a module substrate to which the device is electrically connected. In some cases, the module includes a cap (i.e., a capped module) which seals the electronic device within the module. In other cases, the module does not include a cap (i.e., is a bare die module).

Bare dies are generally preferred over capped modules from a thermal performance perspective. In the case of a capped module, a heat sink is typically attached with a thermal interface between a bottom surface of the heat sink and a top surface of the cap, and another thermal interface between a bottom surface of the cap and a top surface of the electronic device. In the case of a bare die, a heat sink is typically attached with a thermal interface between a bottom surface of the heat sink and a top surface of the electronic device. Bare dies typically exhibit better thermal performance than capped modules because bare dies eliminate two sources of thermal resistance present in capped modules, i.e., the thermal resistance of the cap and the thermal resistance of the thermal interface between the cap and the electronic device. Accordingly, bare dies may be preferred for electronic components that have high power dissipation.

Air-cooled heat sinks are attached to modules using a variety of attachment mechanisms, such as clamps, screws and other hardware. The attachment mechanism typically applies a force that maintains a thermal interface gap, i.e., the thickness of the thermal interface extending between the heat sink and the module. In the case of a capped module, the cap protects the electronic device from physical damage from the applied force. In the case of a bare die, however, the applied force is transferred directly through the electronic device itself. Consequently, when bare dies are used, the attachment mechanism typically applies a compliant force to decrease stresses on the electronic component.

FIGS. 3-7 depict one enhanced mounting mechanism for holding an air-cooled heat sink in thermal contact with an electronic component. Generally stated, in this embodiment, the air-cooled heat sink apparatus comprises a load frame having load springs and an open region that exposes the electronic component. The load frame is mounted to a circuit board on which the electronic component is mounted. The air-cooled heat sink is disposed on the load frame and has a main body in thermal contact with the electronic component through a thermally conductive material. The air-cooled heat sink has load arms for engaging the load springs. A load plate extends between the load arms and has an actuation element operative to displace the main body relative to the load plate and thereby resiliently deform the load springs and produce a load force that compresses the thermally conductive material to achieve a desired thermal interface gap between the main body and the electronic component. Non-influencing fasteners secure the air-cooled heat sink to the load frame and maintain the desired thermal interface gap.

Figure 3:
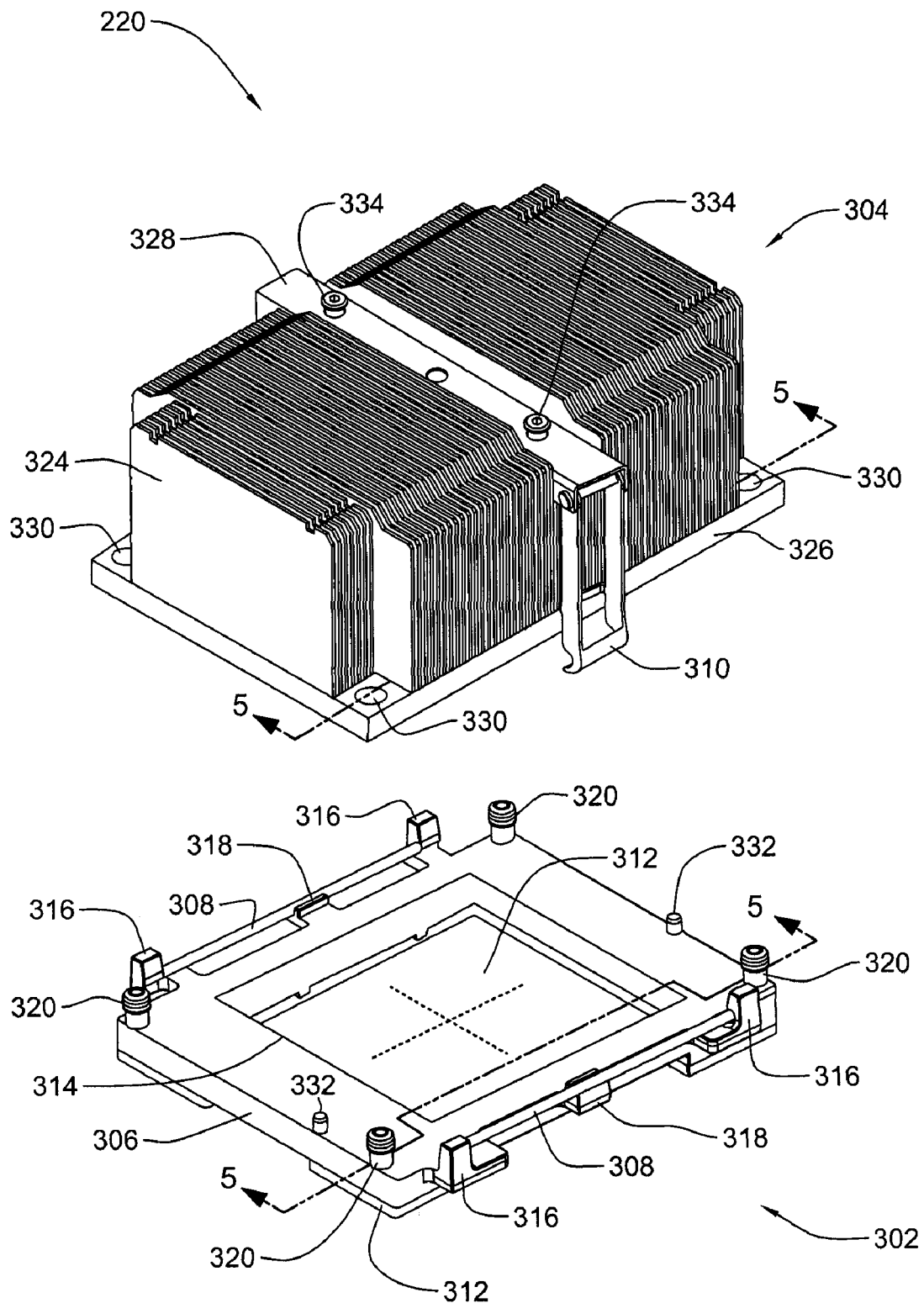
FIG. 3 is a partially exploded perspective view of an air-cooled heat sink apparatus, in accordance with an aspect of the present invention.
Figure 4:
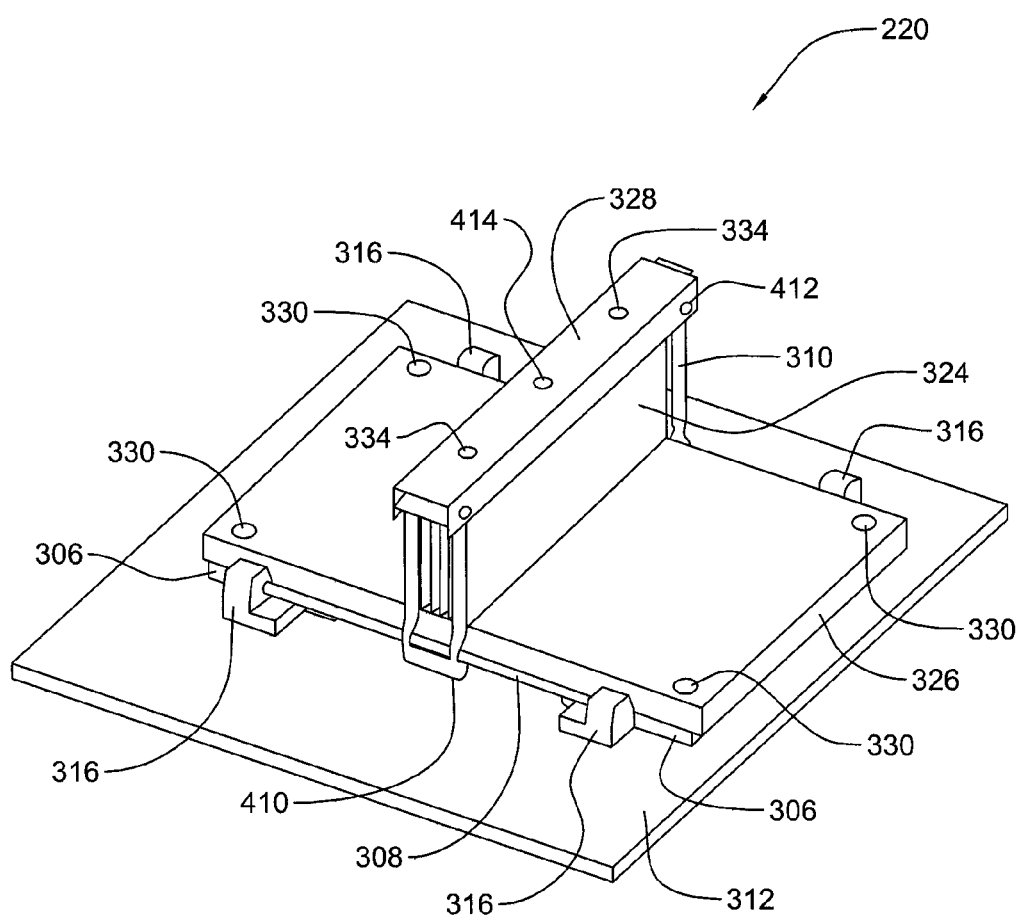
FIG. 4 is a partial perspective view of the air-cooled heat sink apparatus of FIG. 3, in accordance with an aspect of the present invention.
Figure 5:
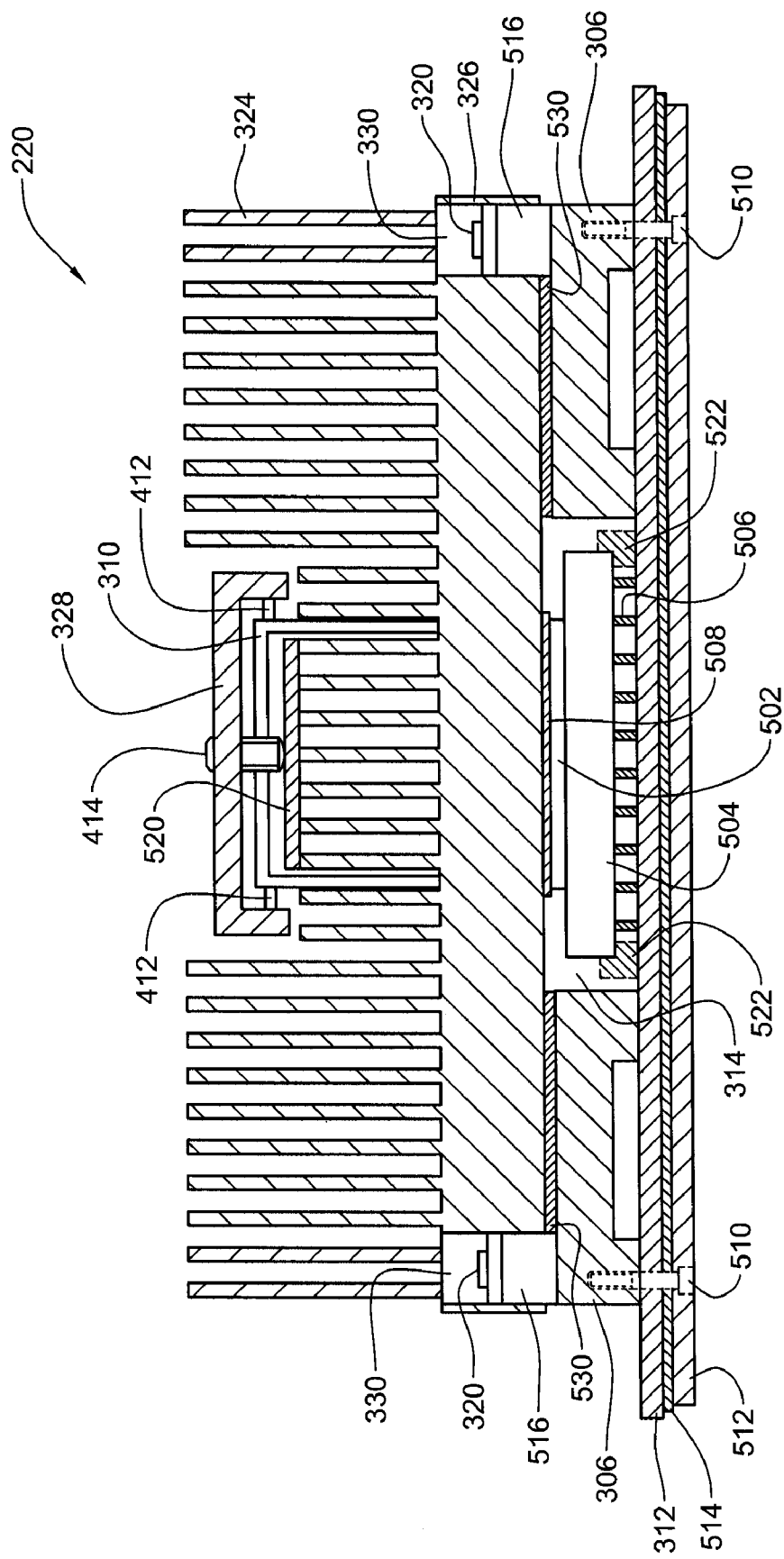
FIG. 5 is a cross-sectional elevational view of an air-cooled heat sink apparatus and electronic component assembly, taken (for example) along line 5-5 of FIG. 3, in accordance with an aspect of the present invention.

Referring to FIGS. 3-5, an air-cooled heat sink 220 is illustrated, which implements an improved process for mounting the heat sink onto the heat source, such as an electronic component. FIGS. 3-5 illustrate major components of an air-cooled heat sink apparatus 220 at a high level, and it should be understood that the number, type and configuration of components may vary depending upon the implementation. For example, the apparatus may contain a different number, type and configuration of electronic modules to be cooled.

As best shown in FIG. 3, air-cooled heat sink apparatus 220 includes two main components, i.e., a load frame/spring assembly 302 and a heat sink/load arm assembly 304. Load frame/spring assembly 302 includes a load frame 306 and a pair of load springs 308. Load frame 306 is preferably made of an alloy material chosen for its low creep properties, such Zamak 8. Zamak 8, also known as ZA-8, is the trade name for a zinc-based alloy, the primary components of which are zinc, aluminum, copper, and magnesium. Creep is the development over time of additional strains in a material. Creep depends on the magnitude of the applied force and its duration, as well as the temperature and pressure. A material having high creep resistance is preferable in the construction of load frame 306 because creep deformation is to be avoided.

Load springs 308 are preferably made of an alloy material chosen for its high tensile strength properties, such as high strength music wire. Although two load springs 308 are shown in FIG. 3, those skilled in the art will appreciate that the present invention may be practiced with any number of load springs 308 (and load arms 310, which engage the load springs 308 as described below in the discussion of heat sink/load arm assembly 304).

Load frame 306 is mounted on a printed circuit board 312. Referring to FIG. 5, fasteners such as screws 510 (two of which are denoted with dotted lines in FIG. 5) are used to attach load frame 306 to printed circuit board 312. In one embodiment, four screws 510 (i.e., one near each corner of load frame 306) pass through thru-holes in a backside stiffener 512, an insulator 514 such as a polyimide, and printed circuit board 312, and are received in threaded holes in load frame 306. This configuration advantageously allows access to screws 510 even when the heat sink/load arm assembly is attached to the load frame/spring assembly.

Returning to FIG. 3, load frame 306 includes one or more open regions 314 into which extends the heat source, e.g., an electronic component (not shown) mounted on printed circuit board 312. For example, a bare die may be mounted on printed circuit board 312 at the location designated at the intersection of the cross-hairs shown in FIG. 3.

As shown in FIG. 3, load frame 306 includes four mounting projections 316 to which the ends of load springs 308 are secured. Load frame 306 also includes two downstop support projections 318 on which rest the mid-sections of load springs 308.

One or more non-influencing fasteners 320 are used to secure heat sink/load arm assembly 304 to load frame/load arm assembly 302. By way of example, four non-influencing fasteners 320 are mounted on load frame 306. Each non-influencing fastener 320 is threaded into a boss 516 (FIG. 5) of load frame 306. The non-influencing fasteners (NIFs) lock the heat sink in position without influencing the position of the heat sink.

Heat sink/load arm assembly 304 includes a heat sink 324 having a base plate 326. Preferably, heat sink 324 is formed with fins, pins or other similar structures to increase the surface area of the heat sink and thereby enhance heat dissipation as air passes over the heat sink. It is also possible for heat sink 324 to contain high performance structures, such as vapor chambers and/or heat pipes, to further enhance heat transfer. For example, heat sink 324 may contain one or more vapor chambers (not shown) charged with deionized water. Heat sink 324 may, for example, be formed of metal, such as copper or aluminum, or of other thermally conductive material, such as graphite-based material.

As mentioned above, heat sink/load arm assembly 304 includes load arms 310. Load arms 310 are hingedly attached to a U-channel load plate 328. Load arms 310 and U-channel load plate 328 may be made of stainless steel, for example, and be configured to provide minimal air flow impedance across the fins of heat sink 324. For example, load arms 310 have an open area through which air may flow. When heat sink/load arm assembly 304 is attached to load frame/spring assembly 302, load arms 310 engage load springs 308. This engagement is described in detail below with reference to FIGS. 4 & 5. In addition, when heat sink/load arm assembly 304 is attached to load frame/spring assembly 302, non-influencing fasteners 320 are received in bore holes 330 in the heat sink's base plate 326. This non-influencing fastener arrangement is described further below with reference to FIGS. 5-6A. To aid in alignment of heat sink/load arm assembly 304 with respect to load frame/spring assembly 302, load frame 306 may include alignment pins 332, which are received in corresponding alignment holes (not shown) in the heat sink's base plate 326.

FIG. 4 is a perspective view of a heat transfer apparatus 220 with portions of heat sink 324 removed. FIG. 5 is a cross-sectional view of heat transfer apparatus 220 engaging an electronic component assembly. As shown in FIGS. 4 & 5, an actuation mechanism applies a preload force to heat sink 324 toward a semiconductor chip 502 (FIG. 5) to compress a thermally conductive material 508 (FIG. 5) and achieve a desired thermal interface gap between heat sink 324 and semiconductor chip 502. The main components of the actuation mechanism include load frame 306, the load frame's mounting projections 316, load springs 308, load arms 310, the load arms' hook portions 410, hinge pins 412, U-channel load plate 328, actuation screw 414, push plate 520, the push plate's guide pins 334, heat sink 324, and the heat sink's base plate 326. Referring to FIG. 3, load arms 310 each include a hook portion 410 that engages one of the load springs 308. Load arms 310 are hingedly attached to U-channel load plate 328 by hinge pins 412. An actuation screw 414 is threaded through U-channel load plate 328 to engage an underlying push plate 520 (FIG. 5). Actuation screw 414 may be, for example, an M3 screw. Actuation screw 414 is accessible for actuation from the top of U-channel load plate 328. The distance between the U-channel plate and push plate 520 is adjusted by turning actuation screw 414. This provides a controlled rate of loading. Those skilled in the art will recognize that other actuation elements and techniques to provide a controlled rate of loading are possible within the scope of the present invention, such as camming, rocking and the like.

Still referring to FIG. 4, when the load frame/spring assembly and the heat sink/load arm assembly are brought together, hook portions 410 of load arms 310 are engaged with load springs 308, and the actuation mechanism is actuated by turning actuation screw 414 in a direction to increase the distance between U-channel load plate 328 and the underlying push plate 520 (FIG. 5). Load springs 308 are deflected by actuation of the actuation mechanism. The geometric parameters of load springs 308, (i.e., the span, cross-section profile, and diameter) are optimized for the allowable space within the application and the required resulting load. Force is transmitted through the heat sink's fins and base plate 326 onto the underlying semiconductor chip 502 (FIG. 5). The force compresses a thermally conductive material 508 (FIG. 5) and achieves a desired thermal interface gap between heat sink's base plate 326 and semiconductor chip 502.

Referring to FIG. 5, push plate 520 is affixed to heat sink 324. For example, push plate 520 may be soldered to heat sink 324 using, for example, SAC 305 solder. Alternatively, push plate 520 may be affixed to heat sink 324 with a suitable adhesive, such as epoxy. Push plate 520 may be made of stainless steel, for example. In one embodiment, push plate 520 is affixed in a location directly above the heat source, with the width of U-channel load plate 328 and push plate 520 substantially capturing the footprint of the heat source. This provides centroidal loading above the bare die, and thus provides substantially no edge stress on the die. As shown in FIG. 5, for example, push plate 520 is affixed to multiple heat sink's fins lying above semiconductor chip 402. Although not shown in FIG. 5, additional modules residing on printed circuit board 312 may be accommodated in open area 314 of load frame 306. In such a case, push plate 520 may be affixed in a location directly over the primary module, with the width of U-channel load plate 328 and push plate 520 substantially capturing the footprint of the primary module.

As shown in FIGS. 3 and 4, the push plate includes guide pins 334 that extend through corresponding holes in U-channel load plate 328. The purpose of guide pins 334 is to align push plate 520 relative to U-channel load plate 328.

As shown in FIG. 5, in one embodiment, the heat generating electronic component comprises one or more bare dies, including a semiconductor chip 502, a module substrate 504, and an electronic connector 506. However, those skilled in the art will appreciate that the present invention may be practiced using other types of heat sources such as one or more capped modules and/or other electronic components. The bare die shown in FIG. 5 is a single-chip module (SCM); however, those skilled in the art will recognize that the spirit and scope of the present invention is not limited to SCMs. For example, those skilled in the art will recognize that the present invention may be practiced using one or more multi-chip modules (MCMs), or a combination of MCMs, SCMs and/or other electronic components/heat sources.

It is significant to note that the present invention allows a single heat transfer apparatus to accommodate one or more modules having different footprints. Previous solutions required qualification of individual modules based on differences in footprint. The present invention overcomes this drawback.

The bare die is conventional. Semiconductor chip 502 is electrically connected to module substrate 504. Electronic connector 506, which electrically connects printed circuit board 312 to module substrate 504, may be a pin grid array (PGA), a ceramic column grid array (CCGA), a land grid array (LGA), or the like.

In some cases, electronic connector 506 may be susceptible to being crushed by the force applied by the actuation mechanism. This is problematic not only from the perspective of possible damage to electronic connector 506, but it also throws off the planarity of the stack (i.e., the module substrate 504 and semiconductor chip 502) relative to the heat sink's base plate which causes thermally conductive material 508 to form an uneven thermal interface gap. In such cases, one or more crush protection elements 522 (denoted with a dotted line in FIG. 5) may be inserted along peripheral portions of module substrate 504 between the bottom of module substrate 504 and the top of printed circuit board 312. The crush protection elements 522 may be made of a material such as a polythermal plastic or the like.

Referring to FIG. 5, thermal interface 508 is made of a thermally conductive material such as thermal gel, grease, paste, oil, or other high thermal conductivity material. For example, thermal interface 508 may be made of Shin-Etsu gel or grease with aluminum and/or zinc oxide spheres. Typically, thermal interface 508 is relatively thin so that it may easily transfer heat away from semiconductor chip 502 towards the heat sink's base plate 326. The thickness of thermal interface 508 extending between the bottom of the heat sink's base plate 326 and the top surface of semiconductor chip 502 is referred to as the thermal interface gap. As one example, the thermal interface gap is about 1.2 mil.

Thermally conductive material 508 is dispensed on semiconductor chip 502 prior to bringing the load frame/spring assembly and the heat sink/load arm assembly together. To protect semiconductor 502 as these assemblies are initially brought together, a viscoelastic foam pad 530 may be interposed between the lower surface of the heat sink's base plate 326 and the upper surface of load frame 306.

Those skilled in the art will appreciate that the actuation mechanism shown in FIGS. 4 and 5 is exemplary, and that other actuation mechanisms may be used to apply the preload force within the spirit and scope of the present invention. According to one embodiment of the present invention, once the preload force is applied to achieve the desired thermal gap, irrespective of the actuation mechanism that applied the preload force, one or more non-influencing fasteners are actuated to secure the heat sink to the load frame and maintain the desired thermal gap.

Figure 6:
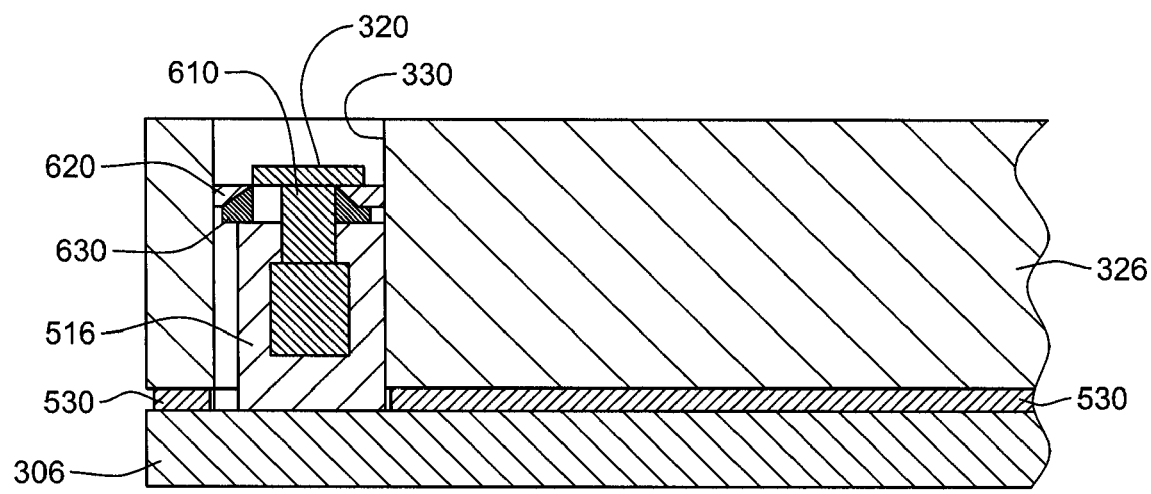
FIG. 6 is a cross-sectional view of a portion of the air-cooled heat sink apparatus of FIGS. 3-5, illustrating a non-influencing fastener arrangement in an actuated state, in accordance with an aspect of the present invention.
Figure 6A:
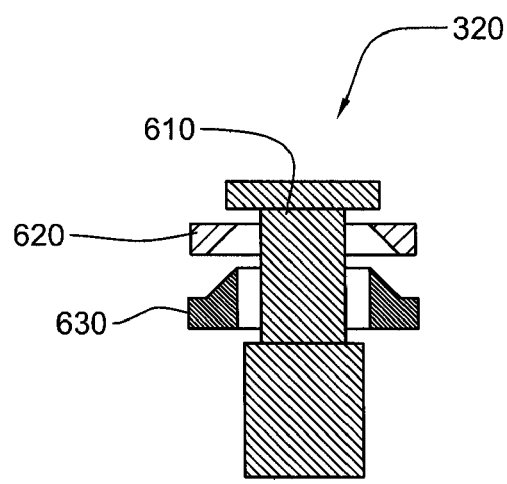
FIG. 6A is a cross-sectional view of the non-influencing fastener of FIG. 6, shown in a non-actuated state, in accordance with an aspect of the present invention.

As shown in FIG. 5, when the heat sink/load arm assembly is attached to the load frame/spring assembly, non-influencing fasteners 320 are received in bore holes 330 in the heat sink's base plate 326. Once the actuation mechanism applies the preload force to achieve the desired thermal interface gap, non-influencing fasteners 320 are actuated to secure heat sink 324 to load frame 306 and maintain the desired thermal gap. One embodiment of a non-influencing fastener arrangement is shown in more detail in FIGS. 6 and 6A. FIG. 6 shows a non-influencing fastener 320 in an actuated state, while FIG. 6A shows non-influencing fastener 320 in a non-actuated state. Non-influencing fastener 320 includes a screw 610 that is threaded into one of the bosses 516 of load frame 306. Captivated on screw 610 are a split taper ring 620 and a solid taper ring 630. Preferably, the taper of split taper ring 620 matches that of solid taper ring 630. Non-influencing fastener 320 is accessible through bore hole 330 in the heat sink's base plate 326, and is actuated by turning screw 610 into the load frame's boss 516 so that split taper ring 620 is expanded against the wall of bore hole 330 in the heat sink's base plate 326. Non-influencing fasteners 320 are advantageous because they can be actuated without significantly altering the thermal interface gap, as would be the case with a conventional fastener.

Figure 7:
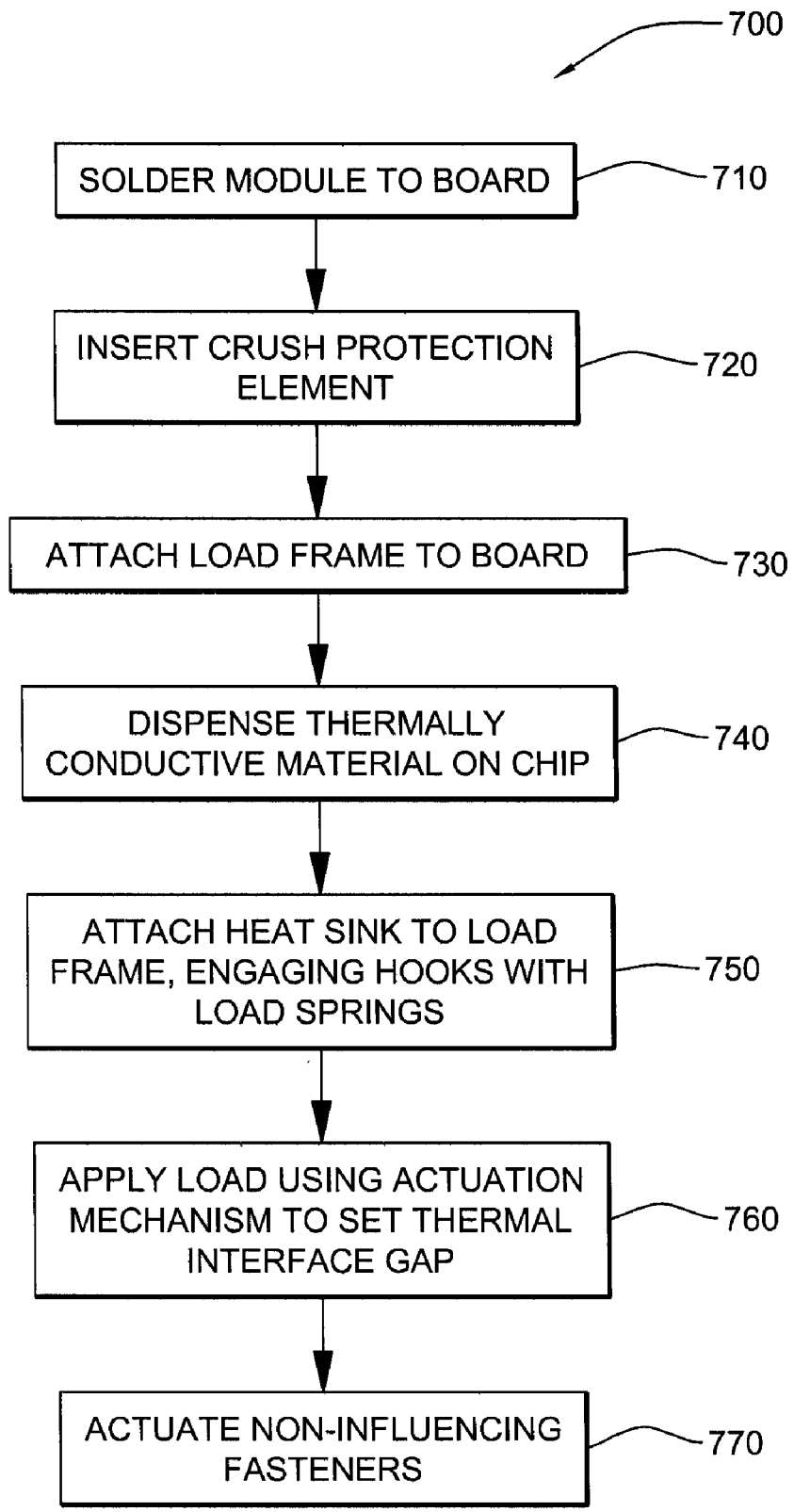
FIG. 7 is a flowchart of one embodiment of a method of mounting an air-cooled heat sink in thermal contact with one or more electronic components, in accordance with an aspect of the present invention.

FIG. 7 is a flow diagram of a method 700 for mounting a heat sink in thermal contact with an electronic component according to one embodiment of the present invention. Method 700 sets forth one order of steps. It should be understood, however, that the various steps may occur at any time relative to one another. Initially, the bare die is soldered to the printed circuit board 710. If a crush protection element is desired, then the crush protection element is inserted along peripheral portions of the module substrate between the bottom of the module substrate and the top of printed circuit board 720. The load frame is attached to the printed circuit board 730. Thermally conductive material is dispensed on the semiconductor chip 740. Next, the heat sink/load arm assembly is aligned and brought into contact with the load frame/spring assembly 750. During step 750, the hook portion of each load arms is brought into engagement with one of the load springs.

Method 700 continues with the application of a preload force using the actuation mechanism to set the thermal interface gap 760. During step 760, the actuation screw is turned an appropriate amount to apply a preload force (e.g., 40 lbs) that provides the desired thermal interface gap (e.g., 1.2 mil). In other words, some of the thermally conductive material is squeezed-out by the preload force to provide the desired thermal gap. Once this point is reached, the assembly may optionally be thermally cured to set the thermal interface gap. Next, the non-influencing fasteners are actuated to secure the heat sink to the load frame and maintain the desired thermal gap (step 770). Preferably, an appropriate torque is applied to the non-influencing fasteners using an X-pattern sequence to minimize the application of any stresses.

Thermal sensors may be used to measure the thermal interface gap achieved by method 700. If the desired thermal interface gap is not achieved, then the unit may be simply reworked by removing the heat sink/load arm assembly from the load frame/spring assembly, and cleaning the thermally conductive material from the semiconductor chip, and returning to step 740.

Figure 8:
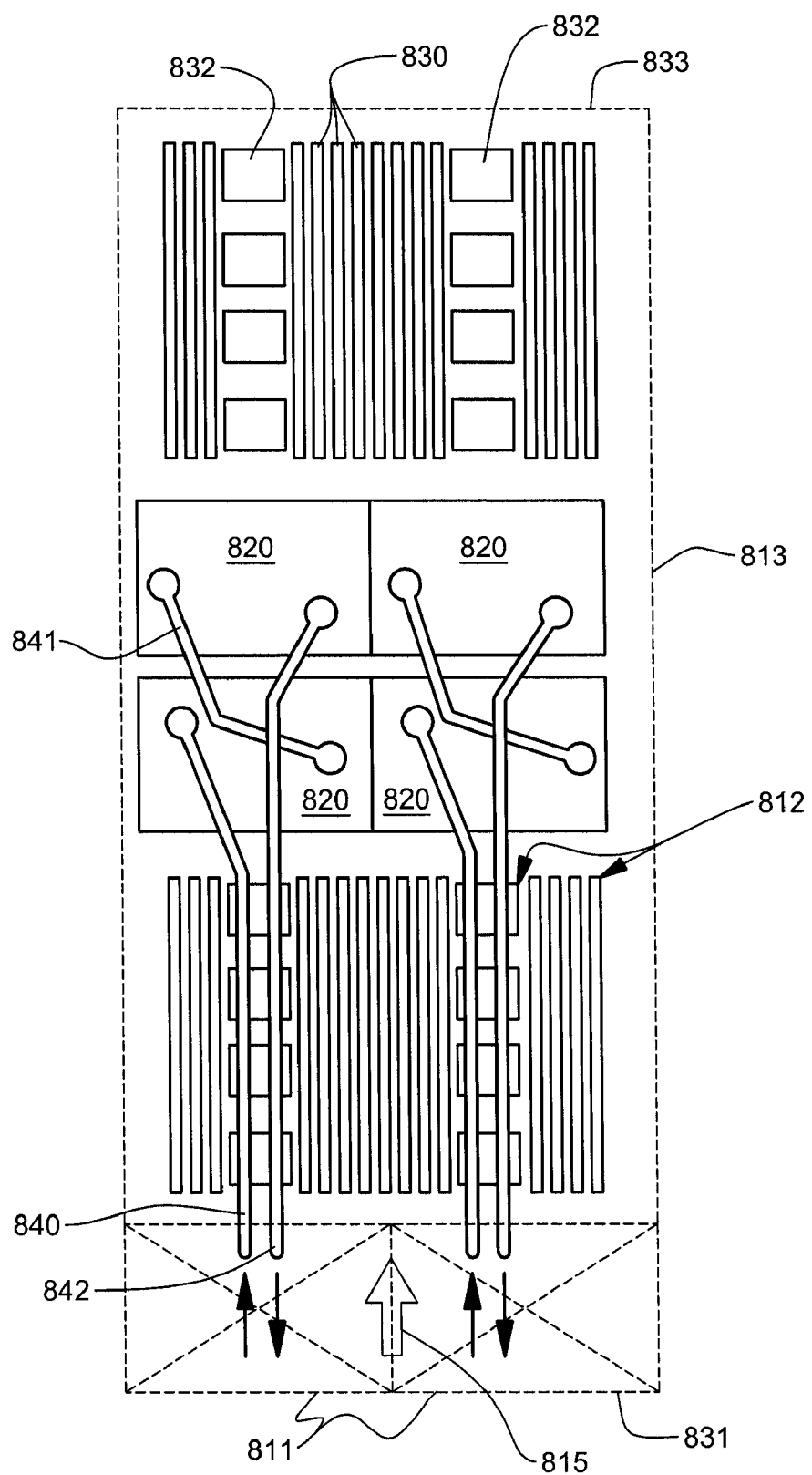
FIG. 8 is a plan view of the electronics drawer layout of FIG. 2 illustrating one alternate embodiment of a cooling system for cooling components of the electronics drawer, in accordance with an aspect of the present invention.

As noted above, in order to provide greater performance, it will eventually be necessary to increase processor chip powers beyond the point where forced air-cooling is feasible as a solution. To meet this increased cooling demand, a liquid-based cooling system is provided herein, with a liquid-cooled cold plate physically coupled to each primary heat generating component to be cooled. FIG. 8 is a depiction of the electronics drawer component layout of FIG. 2, shown with such a cooling system.

More particularly, FIG. 8 depicts one embodiment of an electronics drawer 813 component layout wherein one or more air moving devices 811 provide forced air flow 815 to cool multiple components 812 within electronics drawer 813. Cool air is taken in through a front 831 and exhausted out a back 833 of the drawer. The multiple components to be cooled include multiple processor modules to which liquid-cooled cold plates 820 (of a liquid-based cooling system) are coupled, as well as multiple arrays of memory modules 830 (e.g., dual in-line memory modules (DIMMs)) and multiple rows of memory support modules 832 (e.g., DIMM control modules) to which air-cooled heat sinks are coupled. In the embodiment illustrated, memory modules 830 and the memory support modules 832 are partially arrayed near front 831 of electronics drawer 813, and partially arrayed near back 833 of electronics drawer 813. Also, in the embodiment of FIG. 8, memory modules 830 and the memory support modules 832 are cooled by air flow 815 across the electronics drawer.

The illustrated liquid-based cooling system further includes multiple coolant-carrying tubes connected to and in fluid communication with liquid-cooled cold plates 820. The coolant-carrying tubes comprise sets of coolant-carrying tubes, with each set including (for example) a coolant supply tube 840, a bridge tube 841 and a coolant return tube 842. In this example, each set of tubes provides liquid coolant to a series-connected pair of cold plates 820 (coupled to a pair of processor modules). Coolant flows into a first cold plate of each pair via the coolant supply tube 840 and from the first cold plate to a second cold plate of the pair via bridge tube or line 841, which may or may not be thermally conductive. From the second cold plate of the pair, coolant is returned through the respective coolant return tube 842.

Figure 9:
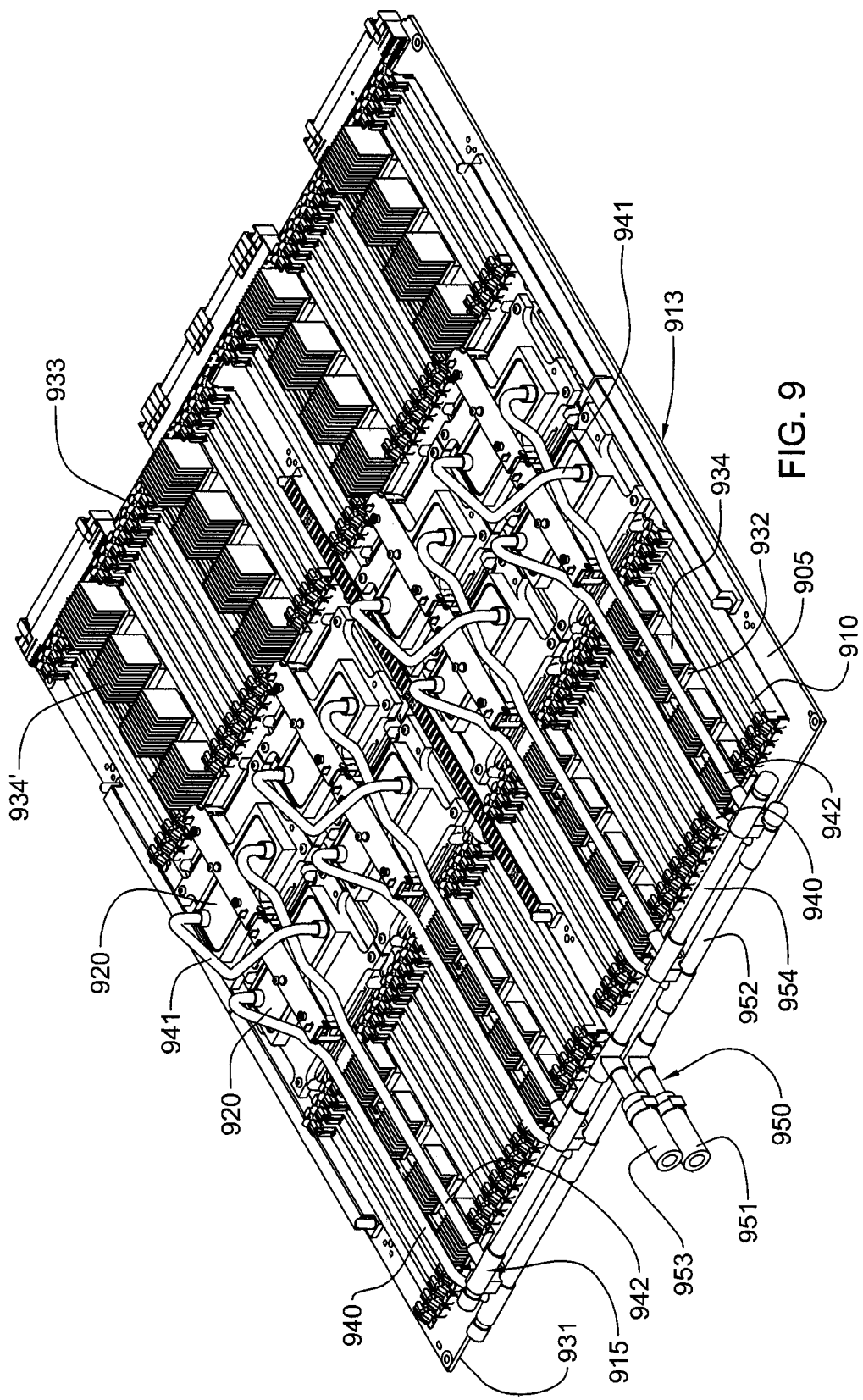
FIG. 9 depicts one detailed embodiment of a partially assembled electronics drawer layout, wherein the electronics system includes eight heat generating electronic components to be actively cooled, each having a respective liquid-cooled cold plate of a liquid-based cooling system coupled thereto, in accordance with an aspect of the present invention.

FIG. 9 depicts in greater detail an alternate electronics drawer layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is chilled water.

As noted, various liquid coolants significantly outperform air in the task of removing heat from heat generating electronic components of an electronics system, and thereby more effectively maintain the components at a desireable temperature for enhanced reliability and peak performance. As liquid-based cooling systems are designed and deployed, it is advantageous to architect systems which maximize reliability and minimize the potential for leaks while meeting all other mechanical, electrical and chemical requirements of a given electronics system implementation. These more robust cooling systems have unique problems in their assembly and implementation. For example, one assembly solution is to utilize multiple fittings within the electronics system, and use flexible plastic or rubber tubing to connect headers, cold plates, pumps and other components. However, such a solution may not meet a given customer's specifications and need for reliability.

Thus, presented herein is a robust and reliable liquid-based cooling system specially preconfigured and prefabricated as a monolithic structure for positioning within a particular electronics drawer.

FIG. 9 depicts is an isometric view of one embodiment of an electronics drawer and monolithic cooling system, in accordance with an aspect of the present invention. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected liquid-cooled cold plates depends, for example on the desired device temperature, available coolant temperature and coolant flow rate, and the total heat load being dissipated from each electronic component.

More particularly, FIG. 9 depicts a partially assembled electronics system 913 and an assembled liquid-based cooling system 915 coupled to primary heat generating components (e.g., including processor dies) to be cooled. In this embodiment, the electronics system is configured for (or as) an electronics drawer of an electronics rack, and includes, by way of example, a support substrate or planar 905, a plurality of memory module sockets 910 (with the memory modules (e.g., dual in-line memory modules) not shown), multiple rows of memory support modules 932 (each having coupled thereto an air-cooled heat sink 934), and multiple processor modules (not shown) disposed below the liquid-cooled cold plates 920 of the liquid-based cooling system 915.

In addition to liquid-cooled cold plates 920, liquid-based cooling system 915 includes multiple coolant-carrying tubes, including coolant supply tubes 940 and coolant return tubes 942 in fluid communication with respective liquid-cooled cold plates 920. The coolant-carrying tubes 940, 942 are also connected to a header (or manifold) subassembly 950 which facilitates distribution of liquid coolant to the coolant supply tubes and return of liquid coolant from the coolant return tubes 942. In this embodiment, the air-cooled heat sinks 934 coupled to memory support modules 932 closer to front 931 of electronics drawer 913 are shorter in height than the air-cooled heat sinks 934' coupled to memory support modules 932 near back 933 of electronics drawer 913. This size difference is to accommodate the coolant-carrying tubes 940, 942 since, in this embodiment, the header subassembly 950 is at the front 931 of the electronics drawer and the multiple liquid-cooled cold plates 920 are in the middle of the drawer.

Figure 10A:
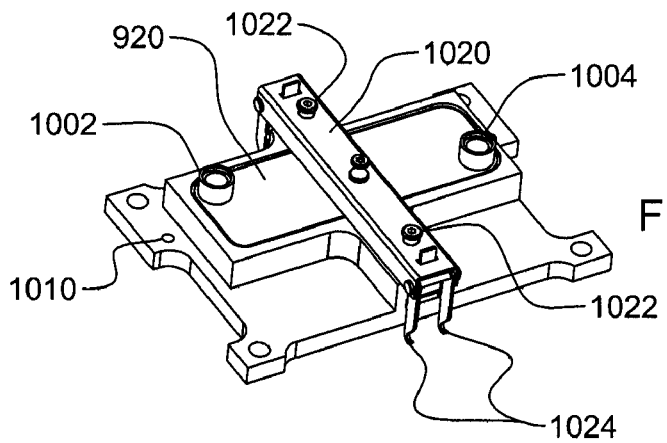
FIG. 10A depicts one embodiment of a liquid-cooled cold plate employed in the cooling system embodiment of FIG. 9, in accordance with an aspect of the present invention.

Referring more particularly to FIGS. 9 & 10A, liquid-based cooling system 915 comprises a preconfigured monolithic structure which includes multiple (pre-assembled) liquid-cooled cold plates 920 configured and disposed in spaced relation to engage respective heat generating electronic components. Each liquid-cooled cold plate 920 includes, in this embodiment, a liquid coolant inlet 1002 (see FIG. 10A) and a liquid coolant outlet 1004, as well as an attachment subassembly 1020 (i.e., a cold plate/load arm assembly). In a similar manner to the heat sink attachment approach of FIGS. 3-7, each attachment subassembly 1020 is employed to couple its respective liquid-cooled cold plate 920 to the associated electronic component to form the cold plate and electronic component assemblies depicted in FIG. 9. Alignment openings (i.e., thru-holes) 1010 are provided on the sides of the cold plate to receive alignment pins 332 (FIG. 3) or positioning dowels 1120 (FIG. 11) during the assembly process, as described further in the above-incorporated patent application entitled "Method of Assembling a Cooling System for a Multi-Component Electronics System". Additionally, connectors (or guide pins) 1022 are included within attachment subassembly 1020 which facilitate use of the attachment assembly, as explained below with reference to FIGS. 11 & 12. Note that load arms 1024 of connector assembly 1020 are also shown in FIG. 10A.

Figure 10B:
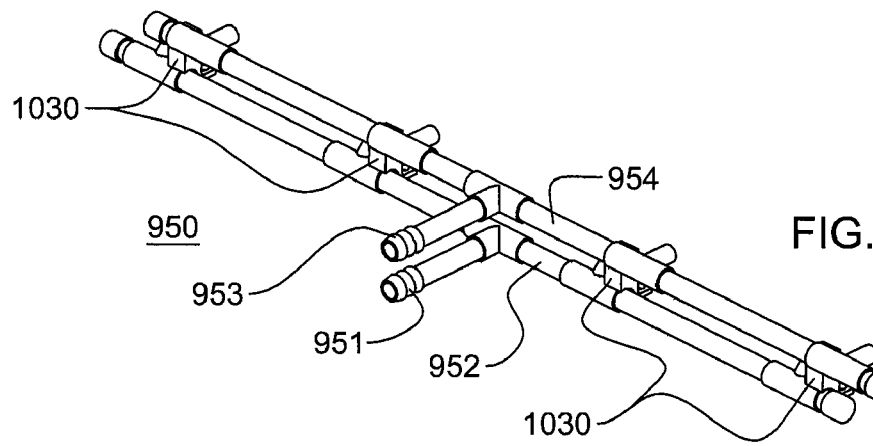
FIG. 10B depicts one embodiment of a liquid-coolant header subassembly employed in the cooling system embodiment of FIG. 9, in accordance with an aspect of the present invention.

As shown in FIGS. 9 & 10B, header subassembly 950 includes two liquid manifolds, i.e., a coolant supply header 952 and a coolant return header 954, which in one embodiment, are coupled together via supporting brackets 1030. In the monolithic cooling structure of FIG. 9, the coolant supply header 952 is metallurgically bonded in fluid communication to each coolant supply tube 940, while the coolant return header 954 is metallurgically bonded in fluid communication to each coolant return tube 952. A single coolant inlet 951 and a single coolant outlet 953 extend from the header subassembly for coupling to the electronics rack's coolant supply and return manifolds (not shown).

Figure 10C:
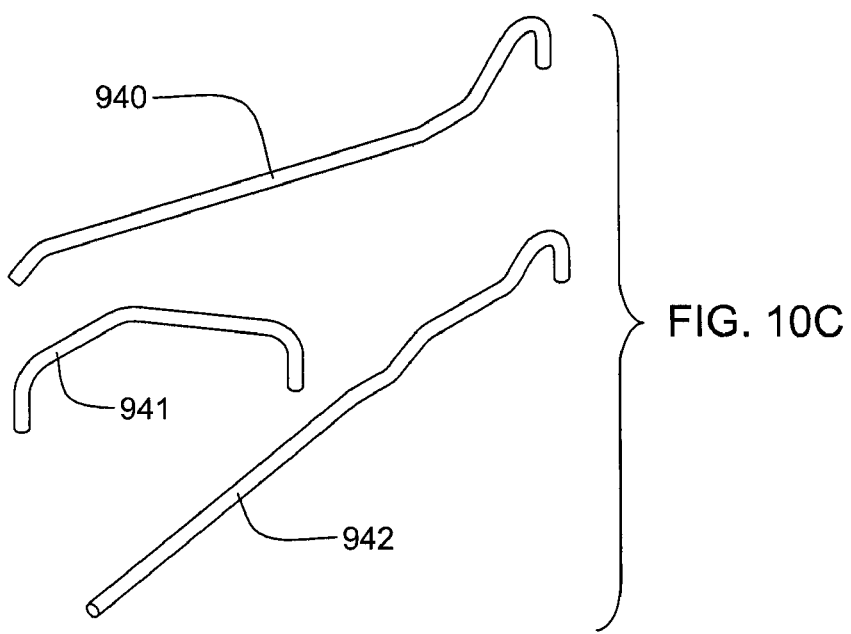
FIG. 10C depicts multiple preconfigured coolant-carrying tubes employed in the cooling system embodiment of FIG. 9, in accordance with an aspect of the present invention.

FIGS. 9 & 10C depict one embodiment of the preconfigured, coolant-carrying tubes. In addition to coolant supply tubes 940 and coolant return tubes 942, bridge tubes or lines 941 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 940, bridge tubes 941 and coolant return tubes 942 are each preconfigured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are preconfigured for a particular electronics system to facilitate installation of the monolithic structure in engaging relation with the electronics system.

To summarize, a cooling system such as disclosed in connection with FIGS. 9-10C advantageously comprises a monolithic structure preconfigured for actively cooling multiple heat generating electronic components of an electronics system. The monolithic structure includes multiple liquid-cooled cold plates disposed in spaced relation, with each liquid-cooled cold plate of the multiple liquid-cooled cold plates being configured and positioned to couple to a respective heat generating electronic component of the multiple heat generating electronic components to be cooled. A plurality of coolant-carrying tubes are metallurgically bonded in fluid communication with multiple cold plates and with a liquid-coolant header subassembly. The liquid-coolant header subassembly includes a coolant supply header metallurgically bonded in fluid communication with the multiple coolant supply tubes and a coolant return header metallurgically bonded in fluid communication with multiple coolant return tubes. When in use, the multiple liquid-cooled cold plates are coupled to respective heat generating electronic components and liquid coolant is distributed through the header subassembly and coolant-carrying tubes to the cold plates for removal of heat generated by the electronic components.

Advantageously, the configuration depicted routes coolant in such a manner as to provide multiple parallel paths through multiple series-connected liquid-cooled cold plates. This configuration facilitates maintaining a desired drawer level pressure drop and a desired electronic component level temperature rise. The monolithic structure is mounted to, for example, the planar circuit board or stiffener via brackets mounted to the header subassembly and a cold plate to electronic component attachment subassembly (see FIGS. 11 & 12) similar to the mounting mechanism depicted and described in detail above in connection with FIGS. 3-7. The cooling system embodiment depicted is designed for direct attachment of the liquid-cooled cold plates to the electronics component to be cooled, which may include one or more bare dies, thereby eliminating the traditional lid and second thermal interface material.

Figure 11:
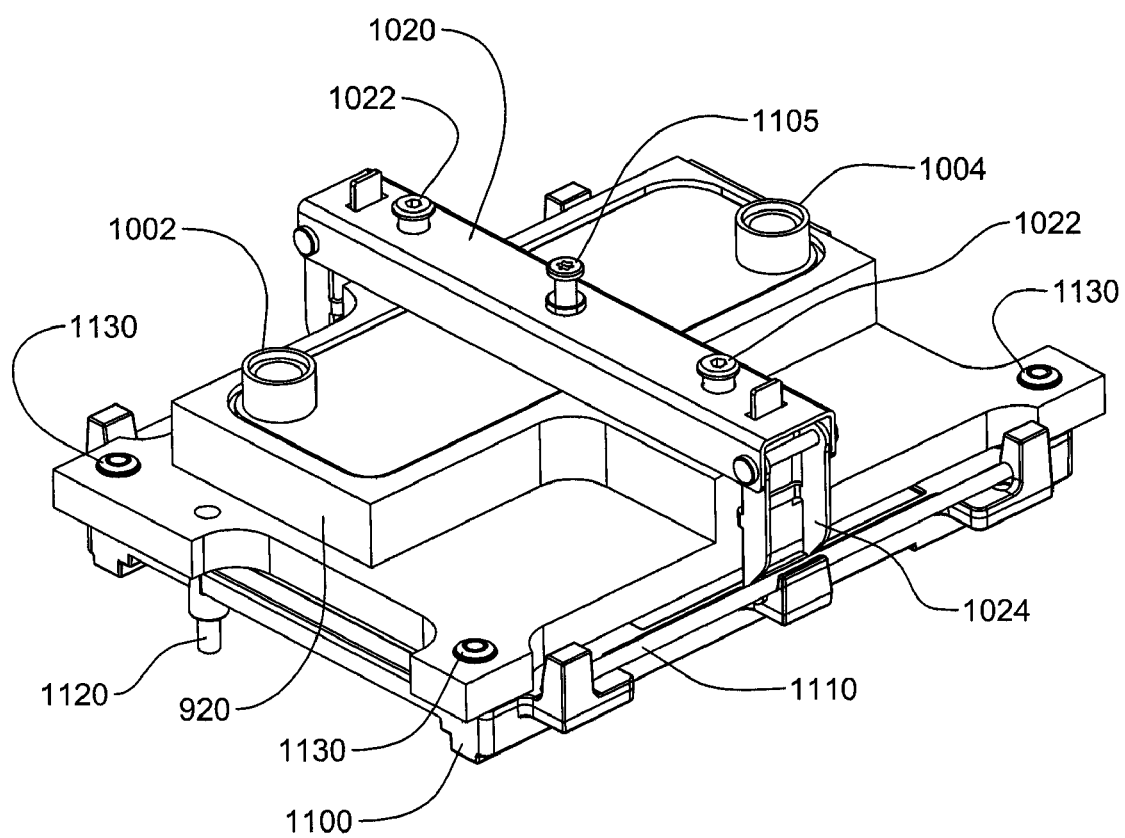
FIG. 11 is a perspective view of one embodiment of a liquid-cooled cold plate and electronic component assembly, in accordance with an aspect of the present invention.
Figure 12:
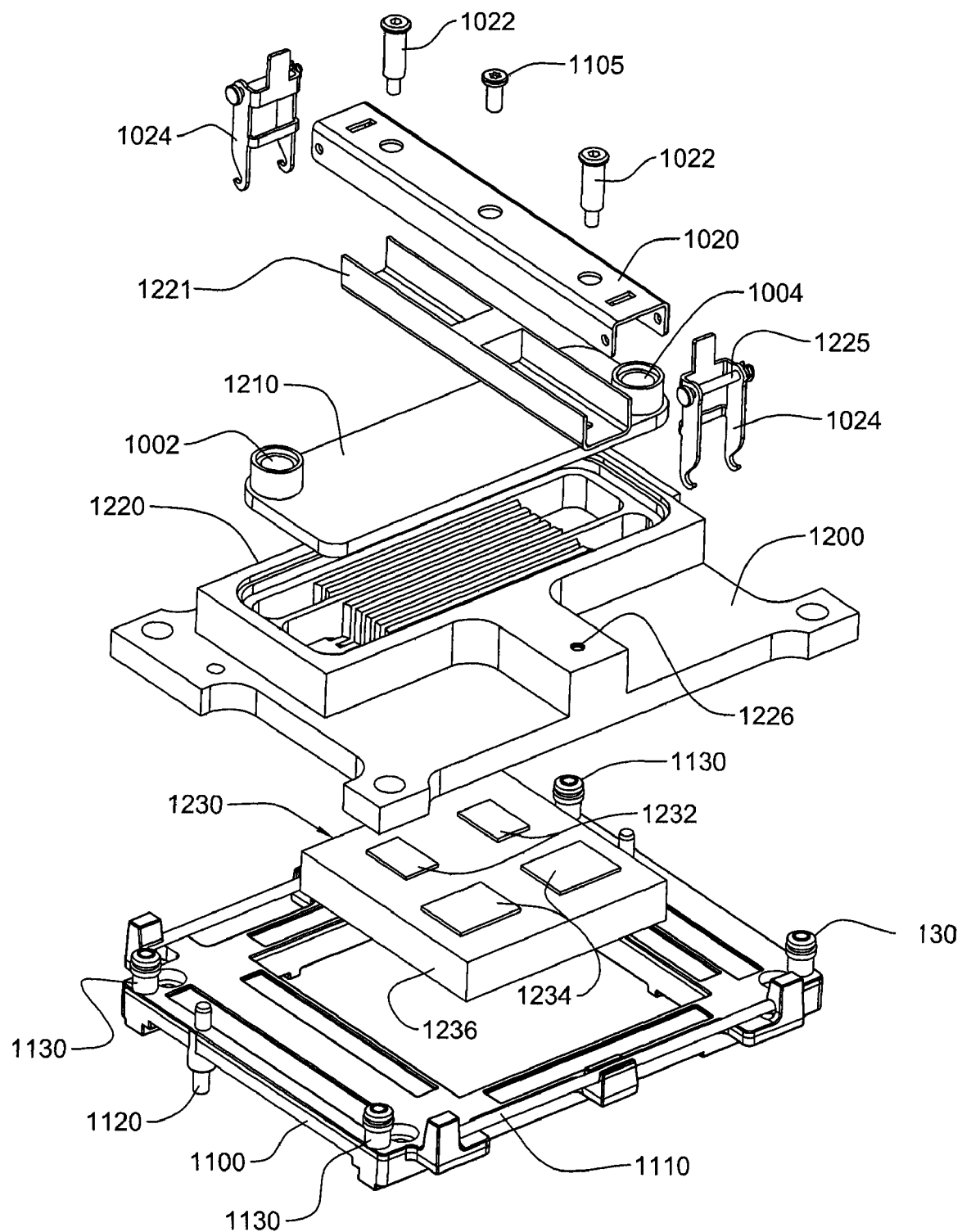
FIG. 12 is an exploded view of the liquid-cooled cold plate and electronic component assembly of FIG. 11, in accordance with an aspect of the present invention.

FIGS. 11 & 12 depict one embodiment of a liquid-cooled cold plate directly attached to an electronic component comprising multiple bare dies residing on a common carrier. As best shown in FIG. 12, the cold plate includes a cold plate base 1200, an active heat transfer region or structure 1220 and a cold plate lid 1210 having, for example, a coolant inlet 1002 and coolant outlet 1004. The heat generating electronic component 1230 includes, in this example, a carrier 1236 supporting two primary heat generating dies 1232 and two secondary heat generating dies 1234, each of which is assumed to be a bare die. Additionally, dies 1232 are assumed to generate greater heat than dies 1234. In the illustrated embodiment, the active heat transfer structure 1220 of the cold plate is configured to reside only over the primary heat generating dies 1232 for more active cooling of the dies compared with dies 1234.

Electronic component 1230 is disposed within a central opening in a loading frame 1100. When in use, loading frame 1100 is affixed to the electronic system's printed circuit board or planar, and sets the position for the loading and cooling hardware. Carrier 1236 of electronic component 1230 is assumed to be mechanically and electrically coupled to the printed circuit board as well. A thermal interface material, such as a thermally conductive gel, is disposed between the bare die back sides and the cold plate's contacting surface, which contacts the bare dies. Again, the active heat transfer structure 1220 of the cold plate is aligned (in this example) only over the high powered bare dies 1232 (e.g., processor dies). This embodiment seeks to cool the higher power chips preferentially in order to maintain a desired junction temperature in all of the devices being cooled.

The attachment subassembly again includes a pair of load springs 1110 connected to load frame 1100. Load frame 1100 is preferably made of an alloy material chosen for its low creep properties, such as Zamak 8, while load springs 1110 are preferably made of an alloy material chosen for its high tensile strength properties, such as a high strength music wire. Although two load springs 1110 are shown in FIGS. 11 & 12, those skilled in the art will appreciate that the present invention may be practiced with any number of load springs 1110. Load frame 1100 is again mounted to the printed circuit board via fasteners, such as the screws described above in connection with the embodiment of FIG. 5. Positioning dowels 1120 on either side of the frame engage respective thru-holes 1301 (FIG. 13) on either side of the cold plate base 1200. One or more non-influencing fasteners 1130 are used to secure the cold plate/load arm assembly to the load frame assembly. By way of example, four non-influencing fasteners 1130 are mounted on load frame 1100. The non-influencing fasteners 1130, which in one embodiment are threaded into respective bosses of load frame 1100, lock the cold plate in position without influencing the position of the cold plate in a manner similar to that described above in connection with FIGS. 3-6A.

The attachment subassembly again includes load arms 1024 hingedly connected via pins 1225 to a U-channel load bracket 1020, which has openings to accommodate load transfer block fasteners 1022. Fasteners 1022 are threaded at their distal ends to engage respective threaded openings 1226 in an upper surface of the cold plate base. Load transfer block fasteners 1022 further function as load bracket retaining dowels in this embodiment. A load transfer block 1221 is disposed below the load bracket 1020 and a load actuation screw 1105 applies compressive force to load transfer block 1221, which in turn applies a compressive load to the cold plate, and hence to the back side of the bare die of the electronic component to ensure a desired thermal interface material thickness, and thus a favorable thermal interface resistance between the bare dies and the contacting surface of the cold plate. As is known, the thermal resistance of the thermal interface material is inversely proportional to the material's thickness. Advantageously, the cold plate base and load transfer block are configured to distribute loading pressure across the raised, planar upper surface of the cold plate base.

Figure 13:
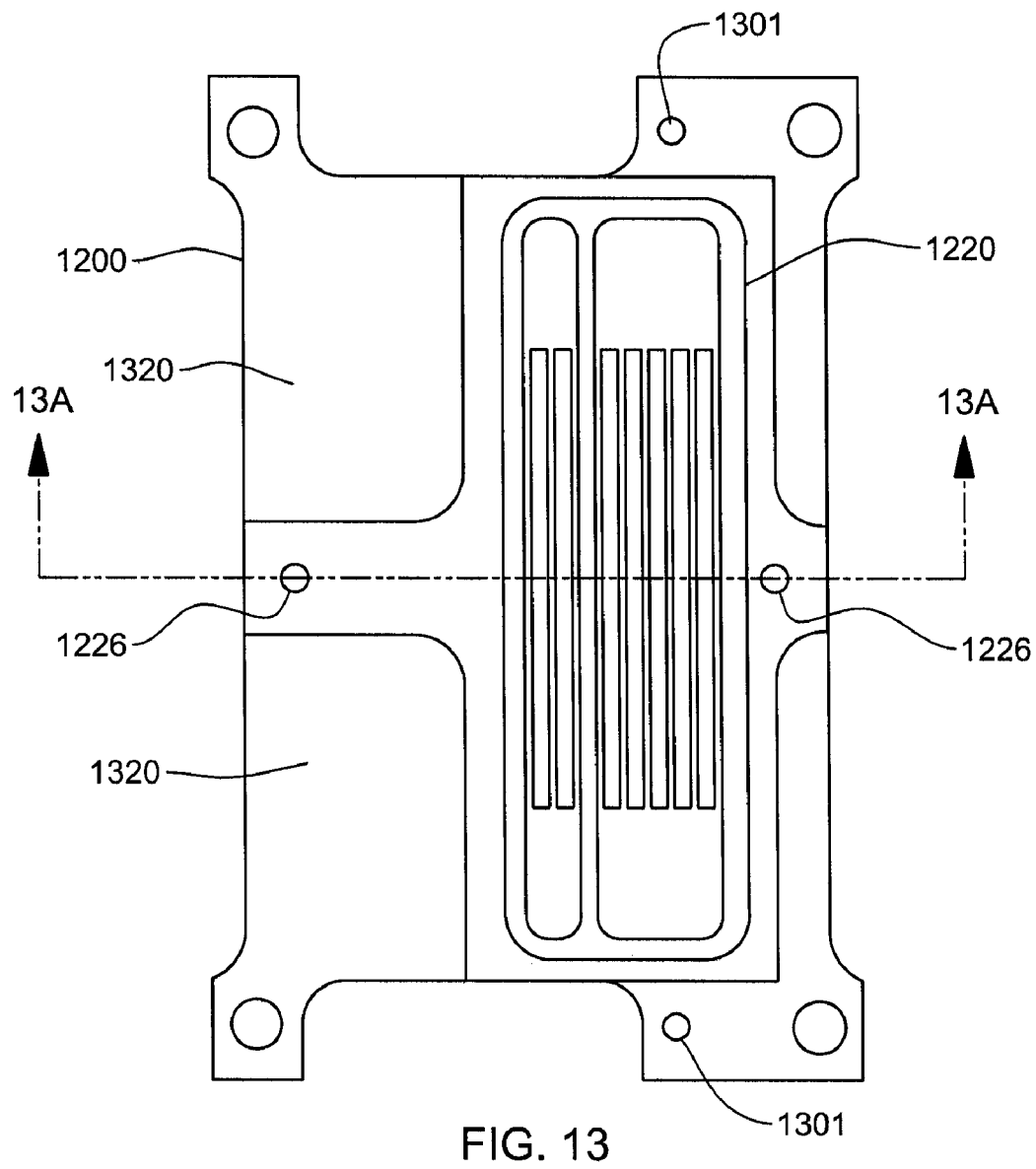
FIG. 13 is a top plan view of one embodiment of a liquid-cooled cold plate (shown with the cover removed) for a cooling system, in accordance with an aspect of the present invention.
Figure 13A:
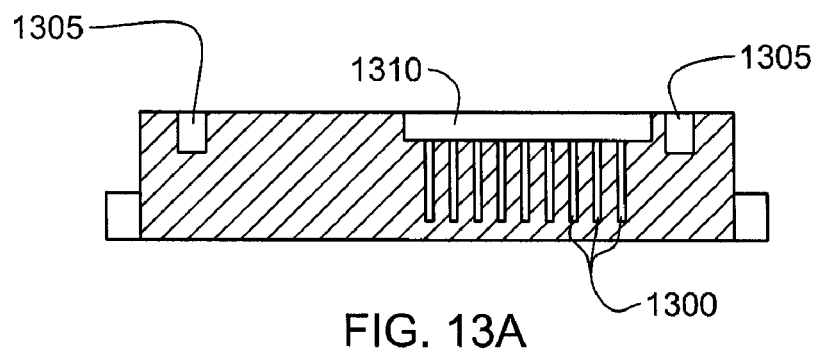
FIG. 13A is a cross-sectional elevational view of the liquid-cooled cold plate of FIG. 13, taken along line 13A-13A, in accordance with an aspect of the present invention.

FIGS. 13 & 13A depict one detailed embodiment of cold plate base 1200. As shown, base 1200 is again configured with active heat transfer structure 1220 extending only over a portion thereof. Within the active heat transfer structure 1220, multiple parallel channels 1300 are disposed for passing liquid coolant therethrough. Dowel receiving thru-holes 1301 are provided on either side of the active heat transfer structure for engaging positioning dowels 1120 (FIG. 12). Further, threaded openings 1226 are provided in the upper surface of the cold plate base 1200 and are located to receive respective load transfer block fasteners 1022 (FIG. 12), as described above. A brazing pocket 1310 is also shown in FIG. 13A for facilitating brazing of cold plate lid 1210 (FIG. 12) to cold plate base 1200. Base cutout areas 1320, which are provided for mass reduction, result in the raised, planar upper surface configuration (when the cold plate lid is attached) illustrated in FIG. 13.

Figure 14:
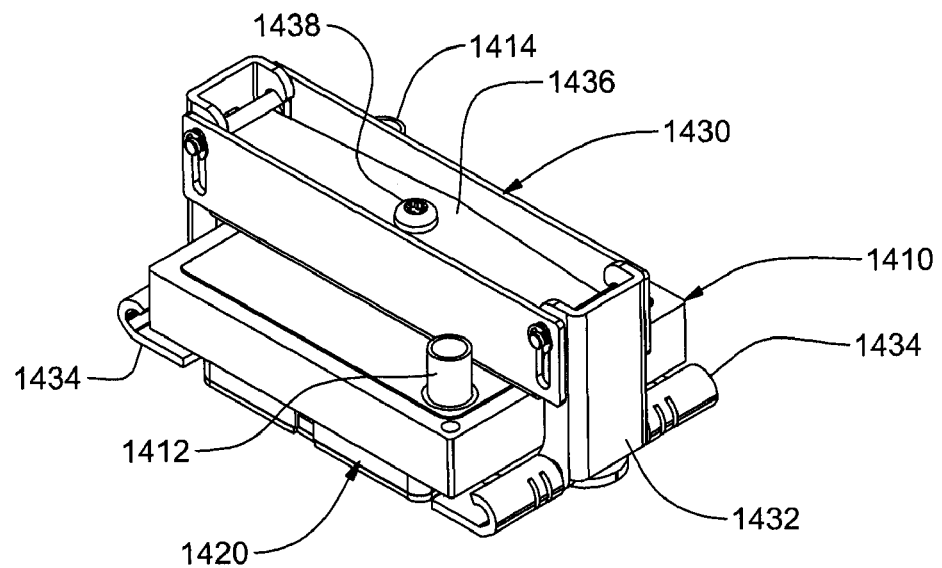
FIG. 14 is an isometric view of an alternate embodiment of a liquid-cooled cold plate for a cooling system, in accordance with an aspect of the present invention.
Figure 14A:
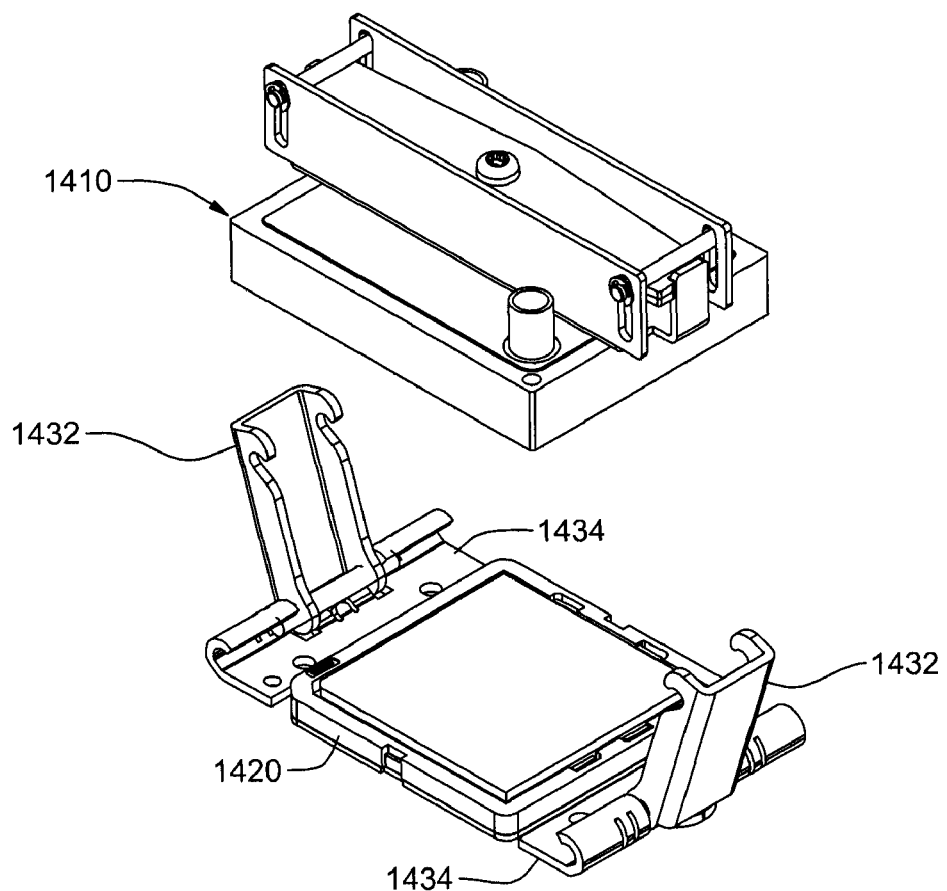
FIG. 14A is a partially exploded view of the liquid-cooled cold plate of FIG. 14, in accordance with an aspect of the present invention.

FIGS. 14 & 14A depict an alternate embodiment of a cold plate to electronic component attachment subassembly. In FIGS. 14 & 14A a single cold plate, electronic component, and attachment assembly is shown. The structure includes a cold plate 1410 mounted to an electronic component 1420 via an attachment subassembly 1430, which includes two loading arms 1432 hingedly mounted to a base 1434 coupled to the substrate (not shown). Laminated spring plates 1436 and an actuation screw 1438 are employed to adjust pressure against cold plate 1410, and hence coupling pressure between cold plate 1410 and electronic component 1420, which is assumed to plug into a corresponding socket in a preconfigured supporting substrate or motherboard. The electronic component 1420 is shown to be a lidded electronic module and may comprise any electronic component to be cooled, including one or more bare die. Features of attachment subassembly 1430 depicted in FIGS. 14 & 14A may be better understood with reference to the above-incorporated patent application entitled "Heat Sink Apparatus for Applying a Specified Compressive Force to an Integrated Circuit Device", U.S. Ser. No. 11/460,334, filed Oct. 10, 2006.

Briefly described, actuation of the attachment subassembly is provided by the fixed travel of the actuation screw 1438 through, for example, two laminated spring plates 1436. Spring plates 1436 reside atop a U-channel structure which physically contacts and is attached to the upper portion of the cold plate. The upper portion of the cold plate is shown to have inlet 1412 and outlet 1414, and is assumed to be brazed to a lower portion of the cold plate. The lower portion of the cold plate has the necessary fin structures and coolant reservoir (e.g., see FIGS. 13 & 13A).

Figure 19:
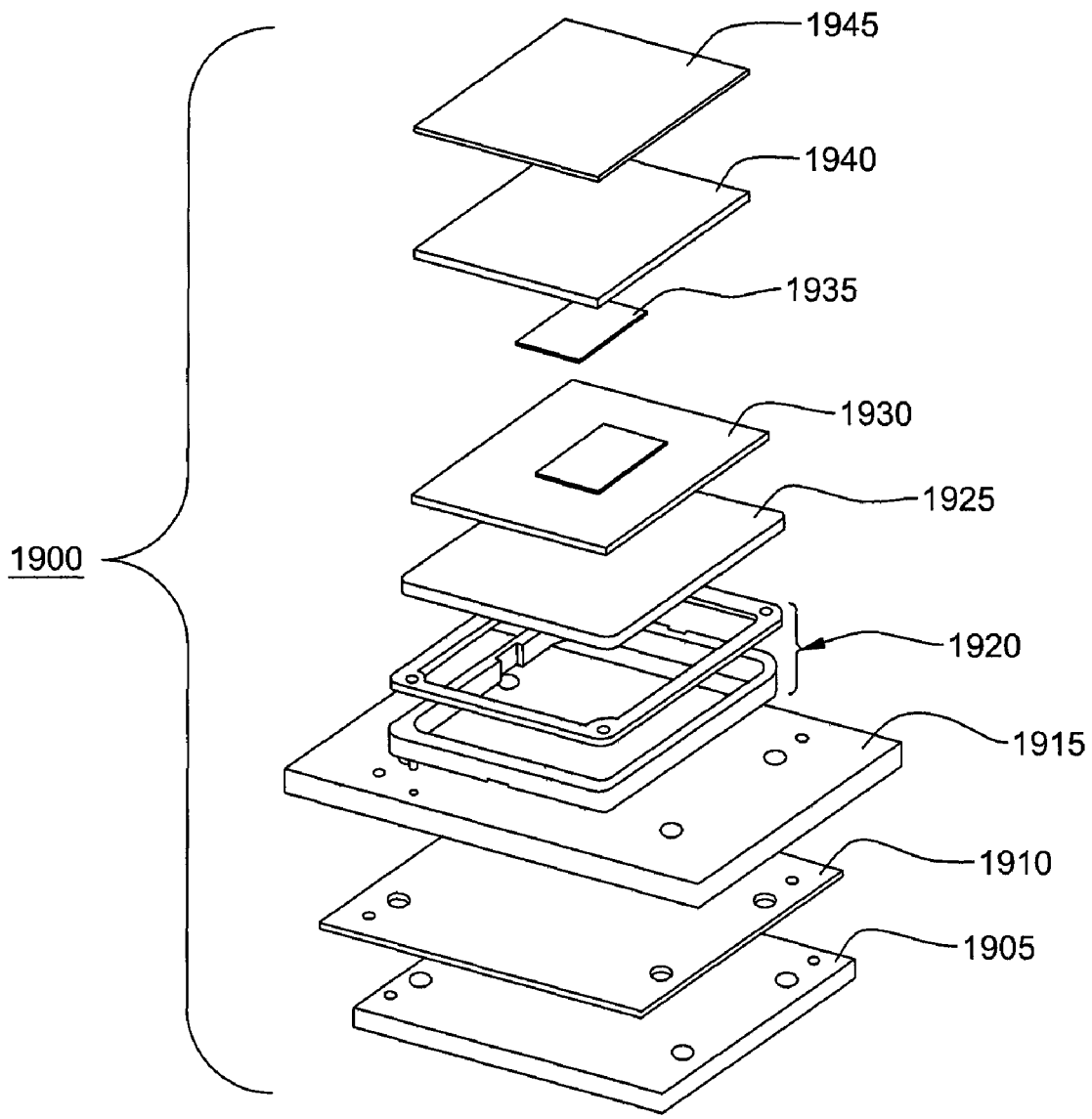
FIG. 19 is an exploded view of one partial stack embodiment of a supporting motherboard and a heat-generating electronic component to which a liquid-cooled cold plate is to be coupled for facilitating the cooling thereof, in accordance with an aspect of the present invention.

Once an actuation load is applied, load arms 1432 on the sides of the attachment subassembly are locked down and the load is maintained. As one example, the load required to actuate one embodiment of a hybrid LGA (land grid array) is 200 pounds. This actuation load provides multiple functions, including: maintaining thermal interface material gap thickness (between the cold plate and electronic component) (see layer 1945 in FIG. 19) to approximately 30-50 microns; providing actuation of individual electrical contacts on the hybrid LGA socket; providing for electronic component tolerances; and providing enough load on the actuation hardware with the needed compliance of the cooling system assembly (e.g., the monolithic cooling system assembly depicted in FIG. 9 above).

Each electronic component is allowed to vary in height by a given tolerance, and a certain amount of height difference is allowed for actuation of the fastening hardware. Compliance in the cooling system is provided by specifically designing the tube interconnections between series-connected cold plates to allow for the necessary actuation pressure to be applied to the individual electrical contacts. It is assumed herein that the coolant-carrying tube layout for interconnecting at least two liquid-cold cold plates in series-fluid communication employs one or more rigid tubes. These one or more rigid tubes are largely non-compliant and create a robust structure that can be brazed together to mitigate the possibility of leaks, as noted above. The coolant-carrying tube layout is configured herein to provide sufficient compliance to accommodate, for example, misalignment of electronic components, as well as tolerance differences. Actuation hardware is provided (e.g., FIGS. 14 & 14A) to mate the electronic component to the corresponding (for example, hybrid LGA) socket on the preconfigured motherboard as it simultaneously squeezes thermal grease between the cold plate and lid of the electronic component to generate the thermal interface (i.e., TIM 2) therebetween. This dual function of the attachment subassembly is described in the above-incorporated co-pending application entitled "Heat Sink Apparatus for Applying a Specified Compressive Force to an Integrated Circuit Device".

Figure 15:
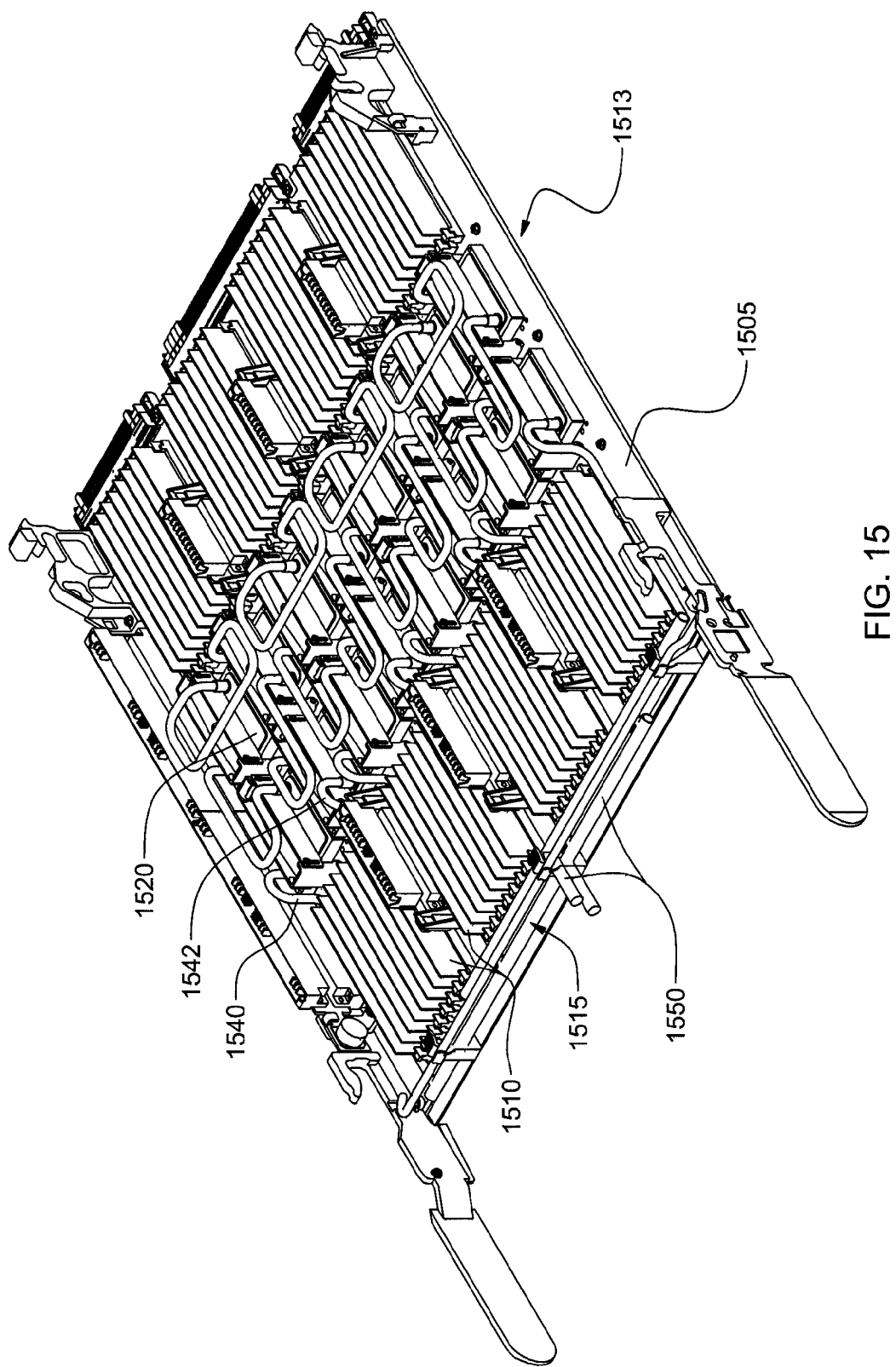
FIG. 15 depicts an alternate detailed embodiment of a partially assembled electronics drawer layout, wherein the electronics system includes sixteen primary heat-generating electronic components to be actively cooled, each having a respective liquid-cooled cold plate of a cooling system associated therewith, in accordance with an aspect of the present invention.
Figure 16:
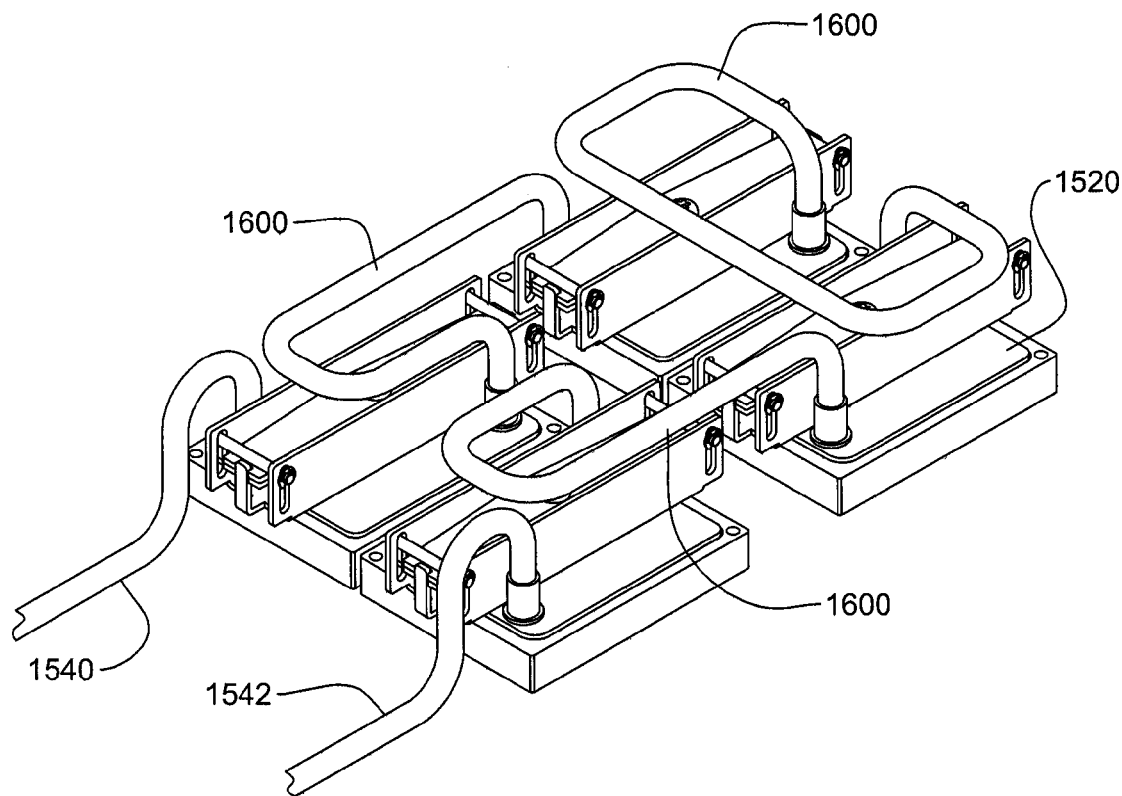
FIG. 16 is an isometric view of one embodiment of one cooling subassembly of multiple cooling subassemblies employed in the cooling system for the electronics drawer layout of FIG. 15, in accordance with an aspect of the present invention.

FIG. 15 depicts in detail an alternate electronics drawer layout comprising sixteen processor modules, each having a respective liquid-cooled cold plate of a liquid-based cooling system coupled thereto. The liquid-based cooling system is shown to include associated coolant-carrying tubes for facilitating passage of liquid coolant through the liquid-cooled cold plates and a header subassembly to facilitate distribution of liquid coolant to and return of liquid coolant from the liquid-cooled cold plates. By way of example, the liquid-cooled cold plates are configured in multiple cooling subassemblies, each cooling subassembly comprising four liquid-cooled cold plates connected in series-fluid communication between a coolant supply tube 1540 and a coolant return tube 1542 as shown in FIG. 16.

Presented herein is a robust and reliable liquid-based cooling system and method of configuring a monolithic structure for positioning within a particular electronics drawer configuration. FIG. 15 depicts an isometric view of one embodiment of an assembled electronics system 1513 and an assembled liquid-based cooling system 1515 coupled to primary heat-generating components (e.g., including processor dies) to be cooled. In this embodiment, the electronics system is configured for (or as) an electronics drawer of an electronics rack, and includes, by way of example, a support substrate or motherboard 1505, a plurality of memory modules 1510, and multiple processor modules 1610 (see FIG. 16A) disposed below the liquid-cooled cold plates 1520 of the liquid-based cooling system 1515.

In addition to liquid-cooled cold plates 1520, liquid-based cooling system 1515 includes multiple coolant-carrying tubes, including coolant supply tubes 1540 and coolant return tubes 1542 in fluid communication with respective cooling subassemblies. The coolant-carrying tubes 1540, 1542 are also connected to a header (or manifold) subassembly 1550 which facilitates distribution of liquid coolant to the coolant supply tubes and return of liquid coolant from the coolant return tubes. In this embodiment, there are four cooling subassemblies, each comprising four liquid-cooled cold plates 1520 coupled in series-fluid communication employing multiple rigid tubes 1600 as shown in FIG. 16. The multiple rigid tubes 1600 couple, for example, the coolant outlet of one liquid-cooled cold plate to the coolant inlet of another liquid-cooled cold plate of the four series-connected liquid-cooled cold plates.

As noted, disclosed herein (in one aspect) are methods for configuring coolant-carrying tube layouts for interconnecting in-series multiple liquid-cooled cold plates using substantially rigid tubes, while still providing sufficient compliance to avoid an unacceptable reduction in actuation load resulting from the use of the rigid tubes in the coolant-carrying tube layout. The methods disclosed herein employ substantially rigid metallic tubing and provide sufficient compliance to meet displacement requirements for actuation loading, as well as relative positional tolerances for a given preconfigured cooling system. Tubing layout is designed to satisfy the desired fluidic arrangement among the liquid-cooled cold plates, then (in one embodiment) finite element analysis is done to determine stresses on the tubing, and loss of actuation load resulting therefrom.

As a specific example, for an LGA electrical socket, 30 grams per connection is required for an acceptable and reliable electrical connection. The actuation hardware is designed to provide this level of actuation, plus a small margin in the absence of the coolant-carrying tubing. Three-dimensional numerical analysis of stress and strain on a created coolant-carrying tube layout is employed to determine (for example) relative planar tilt on an associated liquid-cooled cold plate resulting from an applied actuation load, as well as the reduction in available load to the LGA connections. The resulting information is then used to determine whether lengthened tube portions are needed, or whether to add one or more horizontal bends to interconnecting tubing, with the goal of retaining co-planarity of the electronic component and LGA socket under load, and to reduce the loss of actuation load resulting from the coolant-carrying tube layout. If necessary, the coolant-carrying tube layout is reconfigured, and the reconfigured tube layout is fed back for stress analysis until an acceptable level of co-planarity under load is achieved, and there is a low loss of actuation load (e.g., less than 3% of available actuation load).

Figure 16A:
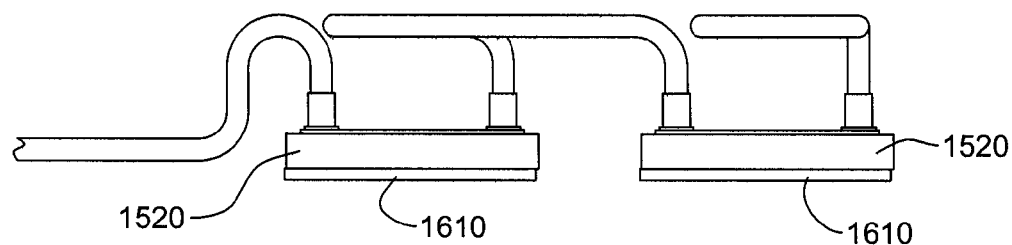
FIG. 16A is an elevational view of the cooling subassembly of FIG. 16, showing coupling of two liquid-cooled cold plates thereof with respective heat-generating electronic components to be cooled, in accordance with an aspect of the present invention.
Figure 17A:
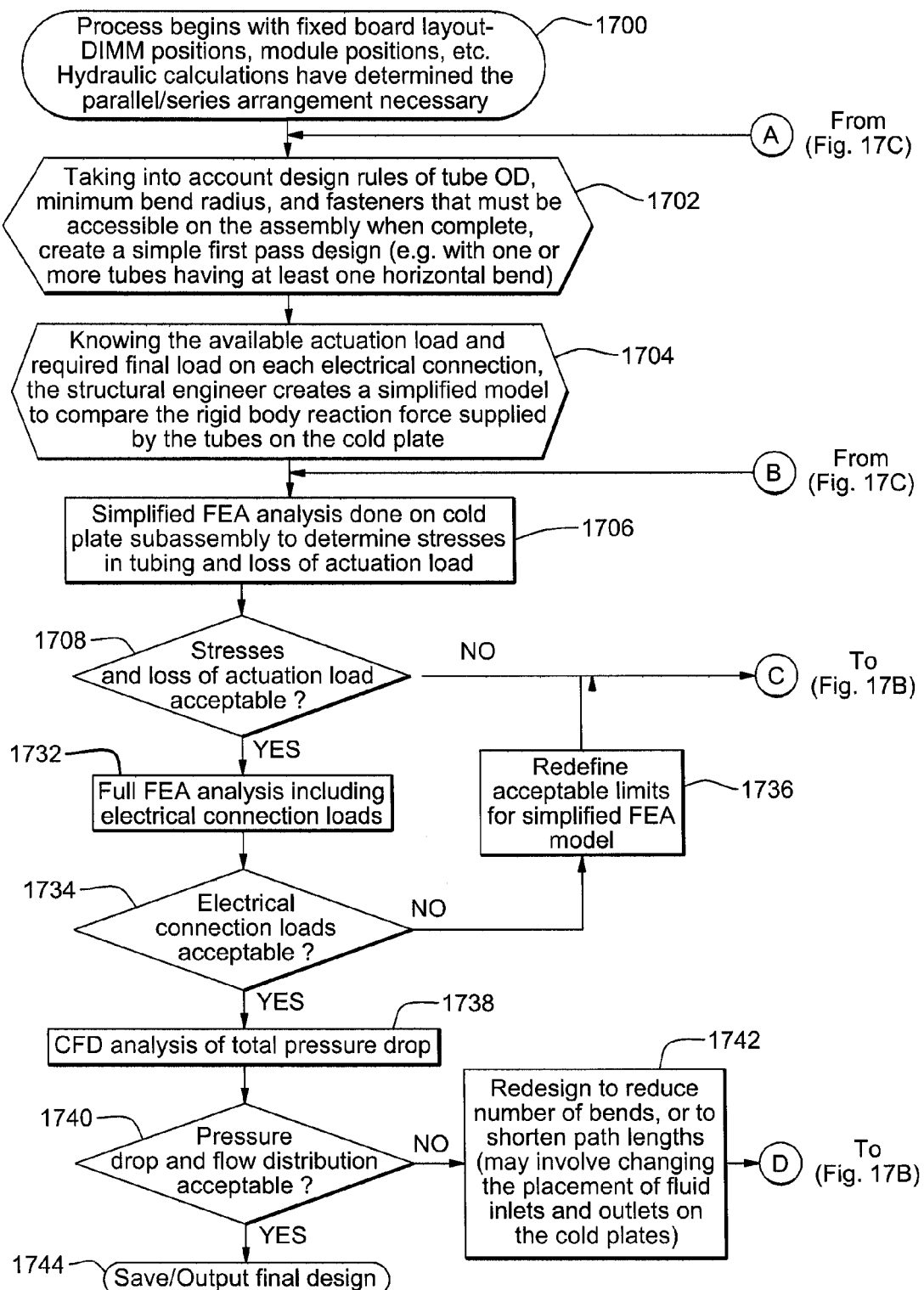
FIGS. 17A, 17B & 17C depict one embodiment of a method for designing a coolant-carrying tube layout for interconnecting multiple series-connected liquid-cooled cold plates of a cooling subassembly, in accordance with an aspect of the present invention.
Figure 17B:
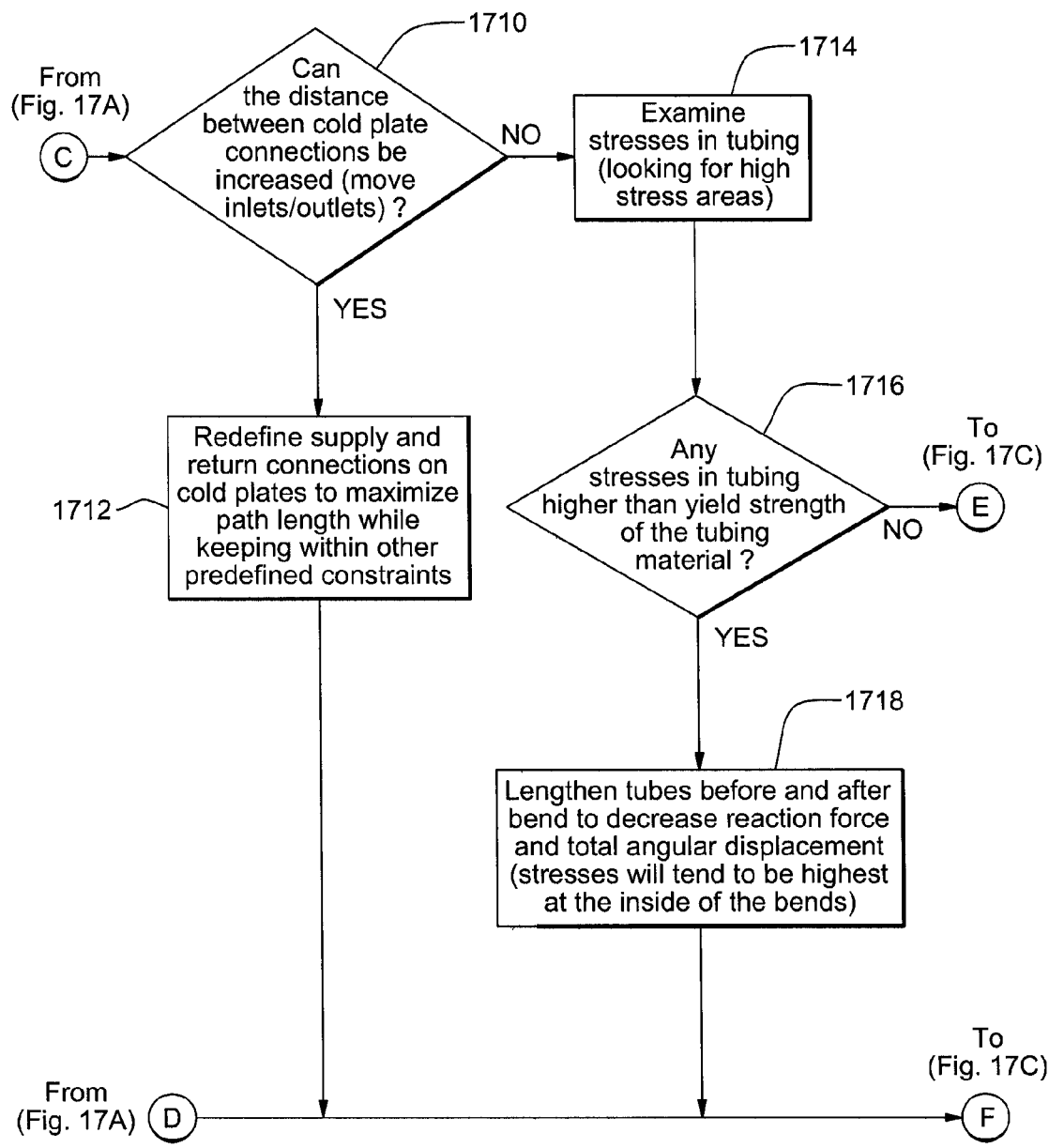
Figure 17C:
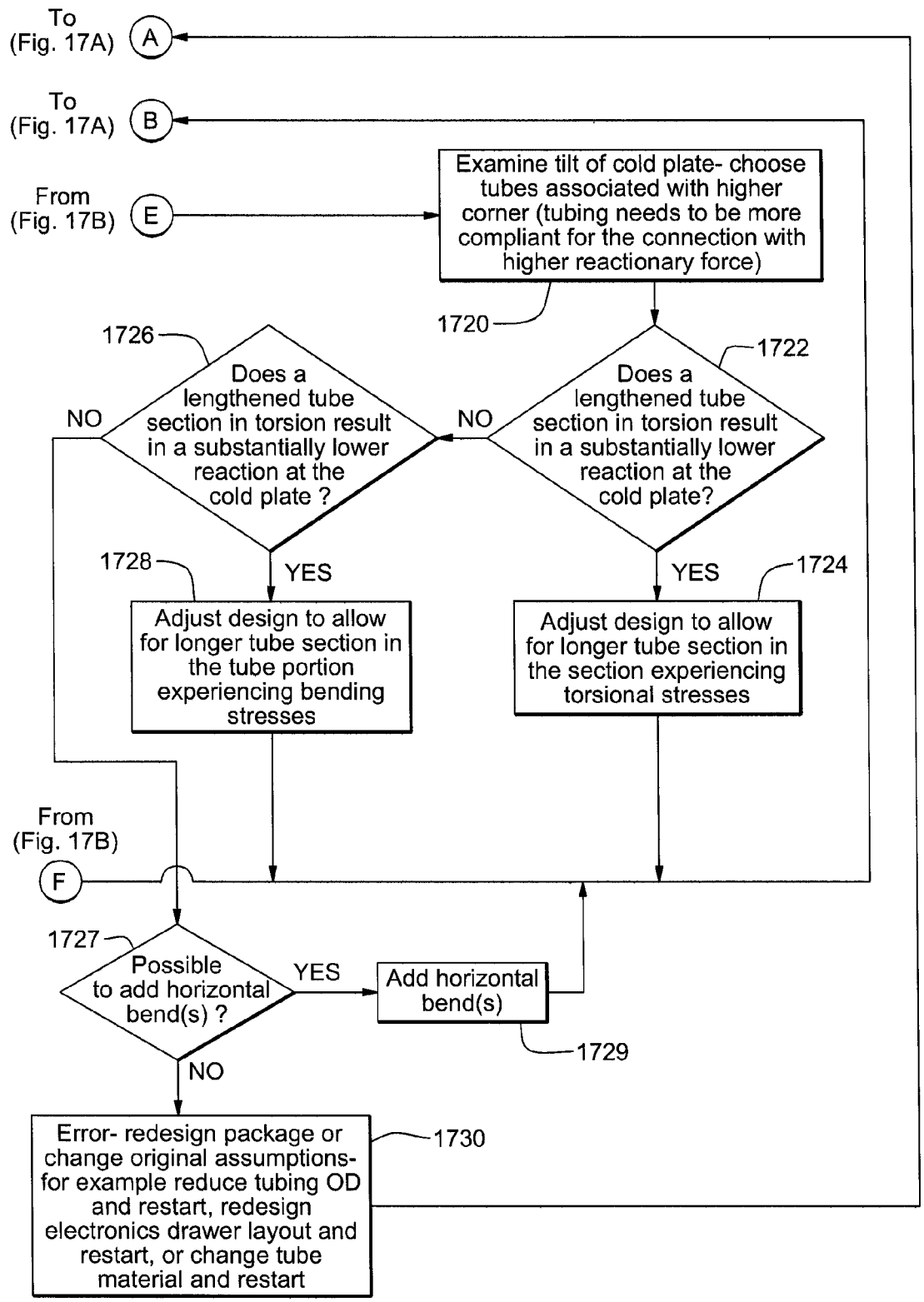

FIGS. 17A-17C depict one detailed embodiment of processing for creating and verifying a coolant-carrying tube layout for a cooling subassembly such as depicted in FIGS. 15-16A.

The process begins with ascertaining a preconfigured electronics system layout, e.g., a fixed motherboard layout, including DIMM positions, electronic component positions, etc. 1700. Hydraulic calculations are employed to determine a particular parallel-series arrangement for the cooling system connections. It is assumed herein that at least two cold plates are connected in-series to form a cooling subassembly, and that (in one embodiment) coolant is fed in parallel to multiple cooling subassemblies of the cooling system. An example of a preconfigured electronics system layout is depicted in FIG. 15. Next, a basic coolant-carrying tube layout is created, taking into account design rules of tube outside diameter, minimum bend radius, and any locations that must be accessible on the electronics system or attachment subassembly when the cooling system is coupled thereto 1702. By way of example, interconnect tubing might include one or more horizontal bends and comprise copper tubing with one-quarter inch OD and 0.030 inch wall thickness, annealed temper and a design limit of 10,000 psi stress. Alternatively, the basic tube layout may be a simplest layout "connecting the dots"; that is, a simplest layout connecting the cold plate outlets and inlets of the cold plates in series-fluid communication within the cooling subassembly (with or without a horizontal bend).

Knowing the available actuation load and required final load on each electrical connection, a simplified structural analysis or simulation is created to analyze the rigid body reaction force applied by the coolant-carrying tube layout of the cooling subassembly 1704. By way of specific example, the available actuation load might be 200 pounds, and the required final load on each electrical connection 30 grams. An example of a simplified analysis is a simplified three-dimensional numerical analysis of stress and strain employing, for example, a finite element analysis simulation product. One example of a finite element analysis simulation product which could be employed in connection with the processing described herein is a structure simulation product, such as those offered by ANSYS, Inc. of Cannonsburg, Pa., USA.

Figure 18:
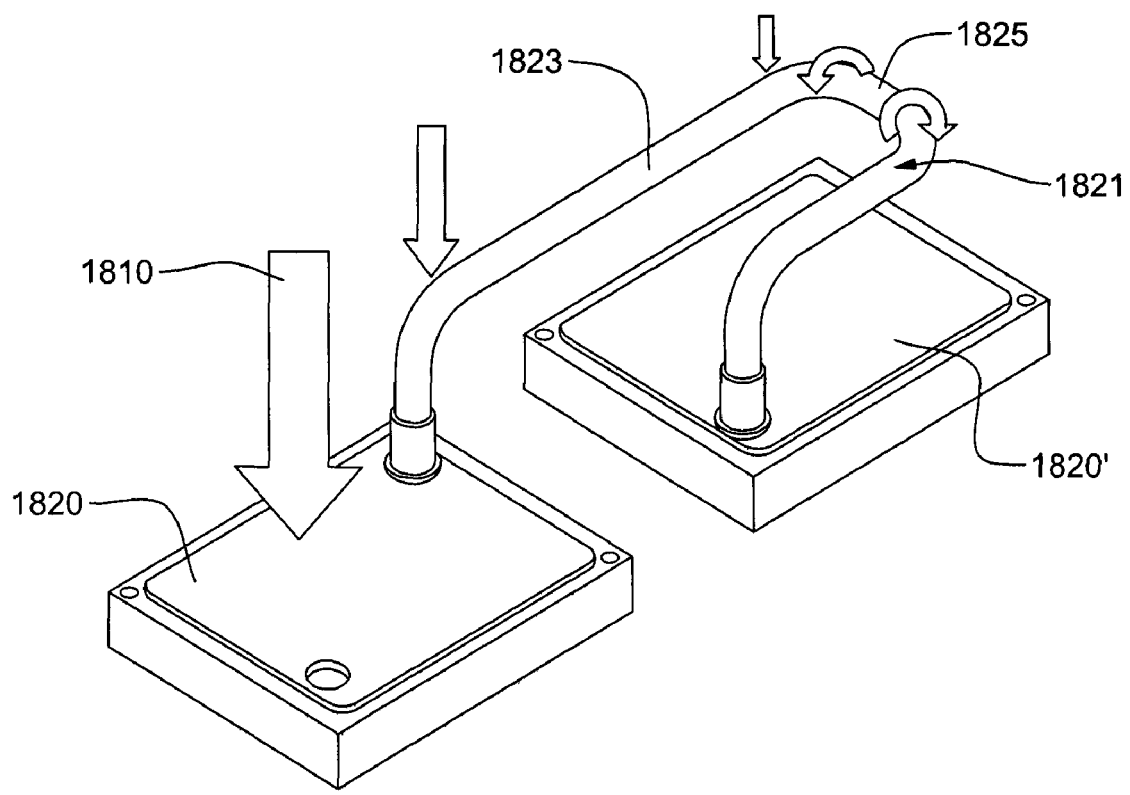
FIG. 18 is an isometric view of two liquid-cooled cold plates to be series-connected employing, in part, a rigid tube comprising a tube portion in bending and a tube portion in torsion when a force is applied (as illustrated) during the processing of FIGS. 17A-17C, in accordance with an aspect of the present invention.

The simplified analysis is performed on the cooling subassembly to determine stress in the rigid tubing serially interconnecting the liquid-cooled cold plates, as well as loss of actuation load resulting from the coolant-carrying tube layout created 1706. The simplified structural analysis includes the liquid-cooled cold plates and the interconnecting tubing, as illustrated in FIG. 16. By way of example, only the subset of liquid-cooled cold plates within a particular cooling subassembly is included in the analysis. The purpose of this calculation is to determine the required force applied to a cold plate that would result in an amount of deflection commensurate with the anticipated locational tolerance among the electronic component surfaces to be contacted by the cold plates. To facilitate this analysis, all but one of the cold plates (e.g., cold plate 1820' of FIG. 18) are constrained against any motion, while the force is applied in a downward direction to the remaining cold plate 1820, as illustrated in FIG. 18. The resulting deformation is studied, and the magnitude of the force adjusted, until the cold plate is displaced a distance equal to the total tolerance among the electronic component heights within the electronics system. This analysis may be done on the "worst case" cold plate, that is, the cold plate chosen to apply the force and study displacement should be the one that requires the largest amount of force to get the desired displacement. The significance of this required force is that it is the sum total of the force in the Z-direction required to overcome the reactionary forces applied by the rigid tubing interconnecting the liquid-cooled cold plates in series-fluid communication. This reactionary force reduces the amount of force available to make electrical connections between the electronic components to be cooled and the preconfigured motherboard.

As shown in FIG. 18, the simplified analysis applies a load 1810 to one 1820 of the series-connected cold plates 1820, 1820', without considering the electrical connections present. The load is applied until the total misalignment due to tolerance in actuation is achieved by varying the load. For example, it may require 4.5 pounds to deflect liquid-cooled cold plate 1820 by 0.9 mm in the direction normal to the thermal contact surface (i.e., the Z-direction in this example).

Processing then determines if the stresses on the rigid tubing and the loss of actuation load are acceptable 1708. If stress (in this example) exceeds 10,000 psi in the rigid tube, or if the loss of actuation load exceeds (for example) 5 pounds, then the actuation load is unacceptable, and processing determines whether any distance between a cold plate outlet and a cold plate inlet in the cooling subassembly can be increased; that is, whether the outlet or inlet on a particular cold plate can be moved 1710. This inquiry takes into account any predetermined design rules regarding accessibility of one or more locations of the assembly once the cooling system is coupled to the electronics system. If "yes", then the outlet or inlet of one or more liquid-cooled cold plates of the cooling subassembly is moved to, for example, maximize a tube path length of an outlet to inlet tube 1712 interconnecting in-series the two cold plates. This results in a reconfigured coolant-carrying tube layout, which then undergoes simplified stress analysis as described above in connection with step 1706.

If the distance between cold plate connections cannot be increased, then processing examines the stress in the interconnect tubing looking for at least one tube with high stress 1714. For example, stresses in the bends or elbows should not exceed 10,000 psi. The bends or elbows are the regions where stress concentration is typically highest. Determination is then made whether stress in any tubing is higher than the yield strength of the tubing material 1716. As one example, the yield strength of a fully annealed temper copper ACR (i.e., air conditioning and refrigeration) tubing is about 10,000 psi. If tube stress in at least one tube is greater than the yield strength, then the at least one tube is lengthened both before and after the bend having the high stress to decrease the reactionary force and the total angular displacement 1718. It is noted that the stress will tend to be highest at the inside of the bend. A longer tube in the section of the bend closer to the displaced liquid-cooled cold plate has the effect of lengthening the lever arm (i.e., the tube portion in bending 1823 (FIG. 18)) and thus reducing the angular displacement on the high stress area, resulting in a lower strain, and thus lower stress. On the other hand, lengthening of the tube section on the other side of the bend from the displaced cold plate has the effect of reducing reactionary force on the bend supplied by what is in effect the tube portion in torsion (i.e., that tube portion 1825 (FIG. 18) acting as a torsional spring).

Assuming that the stresses in the interconnecting tubes are lower than the yield strength for the tubing material, then processing examines the tilt of one or more cold plates of the cooling subassembly employing the simplified analysis or simulation 1720. If the reactionary force on the tubes (in opposite corners in the embodiment of FIG. 18) are unequal, then the resultant force acting on the cold plate will not be centered on the centroid of the cold plate, thus, any dowels positioning the cold plate relative to the electronics system may bind, or loading on the electrical connections coupling the associated electronic component to the sockets of the motherboard may not be uniform. If one tube supplies more reactionary force than another tube, then the tube supplying the higher reactionary force should be modified. That is, the tube associated with the higher corner of a tilted cold plate is selected for reconfiguration to achieve greater compliance.

Processing determines whether a lengthened tube portion in torsion results in a substantially lower reactionary force on the cold plate 1722. This is based on the simplified analysis and the judgment of the system designer, given the cross-section and strength of tube material employed. If the tube is flexible in torsion, then it would be beneficial to load as much of the tubing as possible in torsion to reduce reactionary loads on the liquid-cooled cold plates. If a lengthened tube portion in torsion does reduce the reactionary load, then the coolant-carrying tube layout is reconfigured to allow for the lengthened tube portion in torsion 1724 and the reconfigured tube layout undergoes the simplified analysis. (If necessary, "service loops" are added to increase the tube length by inserting one or more horizontal bends into the tube length (e.g., one or more 90° horizontal bends in the tube)). If a lengthened tube portion in torsion does not reduce the reactionary load, then processing determines whether a lengthened tube section in bending results in a substantially lower reactionary load on the cold plate 1726. This again can be based on the system designer's judgment as to the strength of the tube in bending using the known cross-sectional shape and area moment of inertia, as well as the length of the tube.

It may be beneficial to lengthen tubes that are experiencing a bending condition. If "yes", then the tube layout is reconfigured to allow for the longer tube portion in bending 1728 and the reconfigured tube layout is returned to undergo the simplified stress analysis. If the lengthened tube portion in bending does not result in a substantially lower reactionary force on the cold plate, then processing determines whether one or more horizontal bends can be added to the identified coolant-carrying tube having high stress 1727, and if "yes", one or more horizontal bends are added 1729 and the reconfigured tube layout undergoes the simplified analysis. Otherwise, processing detects an error 1730 and one or more design rules or original assumptions are modified. For example, the tubing outside diameter could be reduced, followed by restart of the design process, or the assumed configuration of the electronics system (e.g., electronics drawer layout) could be modified and the design process restarted, or the tube material employed could be changed, and the design process restarted. This is necessary when all possibilities for improving the tube layout within the given constraints have been exhausted. In this case, one or more design assumptions need to change so that a compromise can be reached.

Returning to inquiry 1708, once stress and loss of actuation load are acceptable, then a more detailed three-dimensional numerical analysis of stress and strain is performed, including the electrical connection loads between the associated electronic components and the motherboard sockets receiving the electronic components 1732. As one example, this detailed analysis includes the cold plate, as well as the hardware illustrated in FIG. 19. This hardware includes, in the illustrated embodiment, a stiffener 1905, an insulator 1910, a supporting motherboard 1915, a perimeter support/seal 1920, an LGA interposer 1925, a bare integrated circuit die and supporting substrate 1930, a first thermal interface material 1935, an electronic component lid 1940 and a second thermal interface material 1945. The purpose of this more detailed simulation is to study the deformation of the cold plate and electronic component, and to determine the force making each of the hundreds (or thousands) of electrical connections between the electronic component and the motherboard.

More particularly, the structure of the electronic component includes a large number (possibly thousands) of metal pads on the bottom surface of the component designed to make electrical connection to similar pads on the motherboard. The LGA interposer includes a structure holding electrically conductive springs, one for each set of metal pads, with a contacting surface on either side. There is a minimum amount of force required to achieve a reliable and secure electrical connection between each component pad, interposer and board pad. To determine the effect of the tubes on the electrical connections, the simplified model is analyzed at the tube to cold plate connection to see what the resultant force of the tube on the cold plate is under the conditions listed above for the simplified simulation. These forces are then applied to the corresponding locations on the cold plate in the detailed simulation. The detailed simulation is then analyzed to determine whether there exists an acceptable load on each of the electrical connections despite the influence of the interconnecting tubes.

If the electrical connection loads are unacceptable 1734, then the acceptable limits for the simplified analysis are redefined 1736. If the simplified analysis indicates acceptable reactionary forces and the detailed analysis indicates electrical connections below the specified acceptable force level, then the success criteria for the simplified analysis must be made more stringent. After redefining the simplified simulation, processing returns to inquiry 1710.

Assuming that the electrical connection loading is acceptable, processing performs computational fluid dynamics analysis on the proposed final design to ensure that the pressure drop and flow characteristics have not changed beyond acceptable limits, as defined initially in step 1700. Examples of computational fluid dynamics products which could be employed to facilitate the analysis are Fluent and/or Ansys CFX, both offered by ANSYS, Inc. of Cannonsburg, Pa., USA. Inquiry is made whether the pressure drop and flow characteristics meet the initial criteria 1740. If "no", then the tube layout is reconfigured to reduce the number of bends, or to shorten one or more path lengths, possibly invoking changing placement of a fluid outlet or inlet of the respective cold plates 1742. The reconfigured tube layout is then fed back to the simplified analysis for repeating of the processing described above. Assuming that the pressure drop and flow characteristics are acceptable, then the final design is achieved and saved 1744.

To summarize, those skilled in the art will note from the above description that provided herein are various methods for configuring a cooling subassembly for an electronics system. By way of example, one method is presented which includes: obtaining a coolant-carrying tube layout for interconnecting multiple liquid-cooled cold plates in series-fluid communication for cooling multiple heat-generating electronic components of an electronics system, the interconnected multiple liquid-cooled cold plates being a cooling subassembly, the multiple heat-generating electronic components to be plugged in fixed spaced relation into corresponding sockets on a supporting motherboard, and the coolant-carrying tube layout comprising at least one rigid coolant-carrying tube; determining for the coolant-carrying tube layout if stress in one or more rigid coolant-carrying tubes thereof exceeds a predetermined acceptable level, and determining if loss of actuation load on a heat-generating electronic component being cooled by the cooling subassembly exceeds an acceptable loss threshold, and if either is true, identifying at least one tube of the coolant-carrying tube layout having high stress, the at least one tube comprising at least one of a tube portion in torsion and a tube portion in bending when a force is applied to at least one liquid-cooled cold plate of the cooling subassembly, and reconfiguring the at least one tube having high stress to produce a reconfigured coolant-carrying tube layout and repeating the determining for the reconfigured coolant-carrying tube layout; performing analysis on the cooling subassembly and the multiple heat-generating electronic components of the electronics system once the coolant-carrying tube layout experiences tube stress below the defined acceptable level and a loss of actuation load on the multiple heat-generating electronic components below the acceptable loss threshold, the analysis including employing the available actuation load on at least part of the cooling subassembly and evaluating electrical connection loading between at least one heat-generating electronic component being cooled thereby and the supporting motherboard into which the at least one heat-generating electronic component electrically connects in fixed spaced relation; and saving or otherwise employing the coolant-carrying tube layout as a final design for interconnecting in series-fluid communication the multiple liquid-cooled cold plates of the cooling subassembly if the electrical connection loading is above an acceptable minimum level.

As an enhancement, the determining includes performing simplified analysis (e.g., a simplified simulation) on the cooling subassembly to determine for the coolant-carrying tube layout stress on the at least one coolant-carrying tube interconnecting the multiple liquid-cooled cold plates and loss of actuation load on at least one heat-generating electronic component of the multiple heat-generating electronic components resulting from the coolant-carrying tube layout. The simplified analysis is performed without evaluating electrical connection loading for the multiple heat-generating electronic components into the supporting motherboard. More particularly, the simplified analysis includes performing a simplified three-dimensional numerical analysis of stress and strain on the cooling subassembly, which in one example, is a finite element analysis simulation of the cooling subassembly to evaluate stress on the at least one coolant-carrying tube interconnecting the multiple liquid-cooled cold plates and loss of actuation load on the at least one heat-generating electronic component of the multiple heat-generating electronic components resulting from the coolant-carrying tube layout. The more detailed analysis on the cooling subassembly and multiple heat-generating electronic components includes performing a three-dimensional numerical analysis of stress and strain on the cooling subassembly and the multiple heat-generating electronic components, including the available actuation load on the cooling subassembly to evaluate electrical connection loading on the multiple heat-generating electronic components and the supporting motherboard into which the multiple heat-generating electronic components electrically connect. In one embodiment, a finite element analysis simulation of the cooling subassembly and multiple heat-generating electronic components is performed to evaluate electrical connection loading on the multiple heat-generating electronic components and the supporting motherboard into which the multiple heat-generating electronic components electrically connect.

The reconfiguring can include, for example, reconfiguring one or more tubes having high stress by introducing one or more bends into the tube(s), lengthening a tube portion in torsion thereof, or lengthening a tube portion in bending thereof. As a more specific example, the reconfiguring can include determining whether a lengthened tube portion in torsion for the at least one tube having high stress produces at least one of a lower stress on the at least one tube or a lower reactionary force on at least one heat-generating electronic component having loss of actuation load beyond the acceptable loss threshold, and if so, reconfiguring the coolant-carrying tube layout to include the lengthened tube portion in torsion and repeating the determining for the reconfigured coolant-carrying tube layout. Otherwise, the reconfiguring can include determining whether a lengthened tube portion in bending for the at least one tube having high stress results in at least one of a lower stress on the at least one tube or a lower reactionary force on the at least one heat-generating electronic component having loss of actuation load beyond the acceptable loss threshold, and if so, reconfiguring the coolant-carrying tube layout to include the lengthened tube portion in bending, and repeating the determining for the reconfigured coolant-carrying tube layout.

Additionally, or alternatively, the reconfiguring can include determining whether a distance between an outlet and an inlet for at least two series-connected liquid-cooled cold plates of the multiple liquid-cooled cold plates can be increased, and if so, redefining a location of at least one of the outlet and the inlet for the at least two series-connected liquid-cooled cold plates to maximize a path length for a coolant-carrying tube interconnecting the outlet and the inlet of the at least two series-connected liquid-cooled cold plates, while maintaining any predefined constraints on the location of the inlet and the outlet for the at least two series-connected liquid-cooled cold plates. Identifying one or more tubes having high stress can include examining tilt of the cold plates when a force is applied to one or more of the cold plates. For at least one liquid-cooled cold plate having tilt, a tube associated with a highest corner thereof is identified as a tube having high stress.

As a further enhancement, the method can include performing computational fluid dynamics analysis on the cooling subassembly to determine if pressure drop and flow distribution are acceptable through the cooling subassembly prior to selecting the coolant-carrying tube layout as the final design. The method includes reconfiguring the coolant-carrying tube layout if pressure drop or flow distribution through the cooling subassembly is unacceptable. This reconfiguring includes at least one of reducing a number of bends in the coolant-carrying tube layout or reducing a length of at least one tube path length in the coolant-carrying tube layout to create a new coolant-carrying tube layout, and repeating the analysis using the new coolant-carrying tube layout.

Aspects of the detailed description presented above are discussed in terms of program procedures executed on a computer, a network or a cluster of computers. These procedural descriptions and representations are used by those skilled in the art to most effectively convey the substance of their work to others skilled in the art. They may be implemented in hardware or software, or a combination of the two.

A procedure is here, and generally, conceived to be a sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers, objects, attributes or the like. It should be noted, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary in many of the operations described herein which form part of the present invention; various ones the operations may be automatic machine operations. Useful machines for performing the operations of the present invention include general purpose digital computers or similar devices.

Aspects of the invention may be implemented in a high level procedural or object-oriented programming language to communicate with a computer. However, the inventive aspects can be implemented in assembly or machine language, if desired. In any case, the language may be a compiled or interpreted language.

Aspects of the invention may be implemented as a mechanism or a computer program product comprising a recording medium. Such a mechanism or computer program product may include, but is not limited to CD-ROMs, diskettes, tapes, hard drives, computer RAM or ROM and/or the electronic, magnetic, optical, biological or other similar embodiment of the program. Indeed, the mechanism or computer program product may include any solid or fluid transmission medium, magnetic or optical, or the like, for storing or transmitting signals readable by a machine for controlling the operation of a general or special purpose programmable computer according to the method of the invention and/or to structure its components in accordance with a system of the invention.

Aspects of the invention may also be implemented in a system. A system may comprise a computer that includes a processor and a memory device and optionally, a storage device, an output device such as a video display and/or an input device such as a keyboard or computer mouse. Moreover, a system may comprise an interconnected network of computers. Computers may equally be in stand-alone form (such as the traditional desktop personal computer) or integrated into another environment (such as a partially clustered computing environment). The system may be specially constructed for the required purposes to perform, for example, the method steps of the invention or it may comprise one or more general purpose computers as selectively activated or reconfigured by a computer program in accordance with the teachings herein stored in the computer(s). The procedures presented herein are not inherently related to a particular computing environment. The required structure for a variety of these systems will appear from the description given.

Again, the capabilities of one or more aspects of the present invention can be implemented in software, firmware, hardware or some combination thereof.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention, and that these are therefore considered to be within the scope of the invention as defined in the following claims. For example, other non-influencing fastener arrangements may be used in lieu of the non-influencing fastener arrangements described above. Moreover, although non-influencing fasteners may be preferable, adhesives may be used in lieu of the non-influencing fasteners described, such as a pressure sensitive adhesive, UV-sensitive adhesive, thermal curing adhesive, epoxy or any other suitable adhesive.

What is claimed is:

1. A method of configuring a cooling subassembly for an electronics system, the method comprising:

obtaining a coolant-carrying tube layout for interconnecting multiple liquid-cooled cold plates in series-fluid communication for cooling multiple heat-generating electronic components of an electronics system, the interconnected multiple liquid-cooled cold plates being a cooling subassembly, the multiple heat-generating electronic components to be cooled to be plugged in fixed spaced relation into corresponding sockets on a preconfigured supporting motherboard, and the coolant-carrying tube layout comprising at least one rigid coolant-carrying tube;

determining, by at least one processor, if stress in one or more coolant-carrying tubes of the coolant-carrying tube layout exceeds a predetermined acceptable level and determining if loss of actuation load on a heat-generating electronic component being cooled by the cooling subassembly exceeds an acceptable loss threshold, and if either is true, identifying at least one tube of the coolant-carrying tube layout having high stress, the at least one tube comprising at least one of a tube portion in torsion and a tube portion in bending when a force is applied to at least one liquid-cooled cold plate of the cooling subassembly, and reconfiguring the at least one tube having high stress to produce a reconfigured coolant-carrying tube layout and repeating the determining for the reconfigured coolant-carrying tube layout;

performing, by the at least one processor, analysis on the cooling subassembly and the multiple heat-generating electronic components of the electronics system once the coolant-carrying tube layout experiences tube stress below the defined acceptable level and a loss of actuation load on the multiple heat-generating electronic components below the acceptable loss threshold, the analysis including employing an available actuation load on at least part of the cooling subassembly and evaluating electrical connection loading between at least one heat-generating electronic component being cooled thereby and the supporting motherboard into which the at least one heat-generating electronic component electrically plugs in fixed spaced relation; and saving, by the at least one processor, the coolant-carrying tube layout as a final design for interconnecting in series-fluid communication the multiple liquid-cooled cold plates of the cooling subassembly if the electrical connection loading is above an acceptable minimum level.

2. The method of claim 1, wherein the determining includes performing a simplified analysis on the cooling subassembly to determine for the coolant-carrying tube layout stress on the at least one coolant-carrying tube interconnecting the multiple liquid-cooled cold plates and loss of actuation load on at least one heat-generating electronic component of the multiple heat-generating electronic components resulting from the coolant-carrying tube layout, the simplified analysis being performed without evaluating electrical connection loading for the multiple heat-generating electronic components into the supporting motherboard.

3. The method of claim 2, wherein performing the simplified analysis comprises performing a simplified three-dimensional numerical analysis of stress and strain on the cooling subassembly, and wherein the performing analysis on the cooling subassembly and the multiple heat-generating electronic components comprises performing a three-dimensional numerical analysis of stress and strain on the cooling subassembly and the multiple heat-generating electronic components, including employing the available actuation load on the cooling subassembly to evaluate electrical connection loading on the multiple heat-generating electronic components and the supporting motherboard into which the multiple heat-generating electronic components electrically connect.

4. The method of claim 3, wherein performing the simplified analysis on the cooling subassembly comprises performing a simplified finite element analysis on the cooling subassembly to evaluate stress on the at least one coolant-carrying tube interconnecting the multiple liquid-cooled cold plates and loss of actuation load on the at least one heat-generating electronic component of the multiple heat-generating electronic components resulting from the coolant-carrying tube layout.

5. The method of claim 3, wherein the performing analysis on the cooling subassembly and the multiple heat-generating electronic components of the electronics system comprises performing a finite element analysis on the cooling subassembly and the multiple heat-generating electronic components, including employing the available actuation load on the cooling subassembly to evaluate electrical connection loading on the multiple heat-generating electronic components and the supporting motherboard into which the multiple heat-generating electronic components electrically connect.

6. The method of claim 1, wherein the reconfiguring comprises for the at least one tube having high stress at least one of introducing at least one horizontal bend into the at least one tube having high stress, lengthening a tube portion in torsion of the at least one tube having high stress, or lengthening a tube portion in bending of the at least one tube having high stress.

7. The method of claim 1, wherein the reconfiguring comprises determining whether a lengthened tube portion in torsion for the at least one tube having high stress produces at least one of a lower stress on the at least one tube or a lower reactionary force on at least one heat-generating electronic component having loss of actuation load beyond the acceptable loss threshold, and if so, reconfiguring the coolant-carrying tube layout to include the lengthened tube portion in torsion and repeating the determining for the reconfigured coolant-carrying tube layout, otherwise, determining whether a lengthened tube portion in bending for the at least one tube having high stress results in at least one of a lower stress on the at least one tube or a lower reactionary force on the at least one heat-generating electronic component having loss of actuation load beyond the acceptable loss threshold, and if so, reconfiguring the coolant-carrying tube layout to include the lengthened tube portion in bending, and repeating the determining for the reconfigured coolant-carrying tube layout.

8. The method of claim 1, wherein the reconfiguring comprises determining whether a distance between an outlet and an inlet for at least two series-connected liquid-cooled cold plates of the multiple liquid-cooled cold plates can be increased, and if so, redefining a location of at least one of the outlet and the inlet for the at least two series-connected liquid-cooled cold plates to maximize a path length for a coolant-carrying tube interconnecting the outlet and the inlet of the at least two series-connected liquid-cooled cold plates while maintaining any predefined constraints on the location of the outlet and the inlet for the at least two series-connected liquid-cooled cold plates.

9. The method of claim 1, wherein identifying at least one tube of the coolant-carrying tube layout having high stress comprises examining tilt of at least one liquid-cooled cold plate when the force is applied to at least one liquid-cooled cold plate of the cooling subassembly, and for at least one liquid-cooled cold plate having tilt, identifying at least one tube associated with a highest corner thereof as the at least one tube having high stress.

10. The method of claim 1, wherein the employing further comprises performing computational fluid dynamics analysis on the cooling subassembly to determine if pressure drop and flow distribution are acceptable through the cooling subassembly prior to selecting the coolant-carrying tube layout as the final design, and wherein the method further comprises reconfiguring the coolant-carrying tube layout if the pressure drop or flow distribution through the cooling subassembly is unacceptable, the reconfiguring including at least one of reducing a number of bends in the coolant-carrying tube layout or reducing a length of at least one tube in the coolant-carrying tube layout to create a new coolant-carrying tube layout, and repeating the determining, the reconfiguring, the performing, and the saving for the new coolant-carrying tube layout.

11. A method of configuring a cooling subassembly for an electronics system, the method comprising:

obtaining a coolant-carrying tube layout for interconnecting multiple liquid-cooled cold plates in series-fluid communication for cooling multiple heat-generating electronic components of an electronics system, the interconnected multiple liquid-cooled cold plates being a cooling subassembly, the multiple heat-generating electronic components to be plugged in fixed spaced relation into corresponding sockets on a preconfigured supporting motherboard, and the coolant-carrying tube layout comprising at least one rigid coolant-carrying tube;

performing, by at least one processor, simplified three-dimensional numerical analysis of stress and strain on the cooling subassembly to determine for the coolant-carrying tube layout stress on at least one coolant-carrying tube interconnecting at least two liquid-cooled cold plates of the multiple liquid-cooled cold plates and loss of actuation load on at least one heat-generating electronic component of the multiple heat-generating electronic components resulting from the coolant-carrying tube layout, the simplified three-dimensional numerical analysis of stress and strain being performed without evaluating electrical connection loading of the multiple heat-generating electronic components into the supporting motherboard employing an available actuation load;

determining, by the at least one processor, if stress in the at least one coolant-carrying tube of the coolant-carrying tube layout exceeds a predefined acceptable level and determining if loss of actuation load on the at least one heat-generating electronic component exceeds an acceptable loss threshold, and if either is true, reconfiguring the coolant-carrying tube layout until stress in the at least one coolant-carrying tube interconnecting the at least two liquid-cooled cold plates is below the predefined acceptable level and the loss of actuation load on the at least one heat-generating electronic component is below the acceptable loss threshold;

performing, by the at least one processor, detailed three-dimensional numerical analysis of stress and strain on the cooling subassembly and the multiple heat-generating electronic components of the electronics system once the coolant-carrying tube layout experiences tube stress below the defined acceptable level and loss of actuation load on the at least one heat-generating electronic component below the acceptable loss threshold, the detailed three-dimensional numerical analysis of stress and strain including employing the available actuation load on the cooling subassembly to evaluate electrical connection loading for the multiple heat-generating electronic components into the sockets on the supporting motherboard; and saving, by the at least one processor, the coolant-carrying tube layout as a final design for interconnecting in series-fluid communication the multiple liquid-cooled cold plates of the cooling subassembly if the electrical connection loading is acceptable.

12. The method of claim 11, wherein the performing simplified three-dimensional numerical analysis of stress and strain comprises performing a finite element analysis on the cooling subassembly to evaluate stress on the at least one coolant-carrying tube interconnecting the multiple liquid-cooled cold plates and loss of actuation load on the multiple heat-generating electronic components resulting from the coolant-carrying tube layout, and wherein the performing detailed three-dimensional numerical analysis of stress and strain comprises performing a finite element analysis on the cooling subassembly and the multiple heat-generating electronic components, including employing the available actuation load on the cooling subassembly to evaluate electrical connection loading of the multiple heat-generating electronic components into the supporting motherboard.

13. The method of claim 11, wherein the reconfiguring comprises for the at least one tube having high stress, at least one of introducing at least one horizontal bend into the at least one tube having high stress, lengthening a tube portion in torsion of the at least one tube having high stress, or lengthening a tube portion in bending of the at least one tube having high stress.

14. The method of claim 11, wherein the reconfiguring comprises determining whether a lengthened tube portion in torsion for the at least one tube having high stress produces at least one of a lower stress on the at least one tube or a lower reactionary force on the at least one heat-generating electronic component having loss of actuation load beyond the acceptable loss threshold, and if so, reconfiguring the coolant-carrying tube layout to include the lengthened tube portion in torsion and repeating the determining for the reconfigured coolant-carrying tube layout, otherwise, determining whether a lengthened tube portion in bending for the at least one tube having high stress results in at least one of a lower stress on the at least one tube or a lower reactionary force on the at least one heat-generating electronic component having loss of actuation load beyond the acceptable loss threshold, and if so, reconfiguring the coolant-carrying tube layout to include the lengthened tube portion in bending, and repeating the determining for the reconfigured coolant-carrying tube layout.

15. The method of claim 11, wherein the reconfiguring comprises determining whether a distance between an outlet and an inlet for at least two series-connected liquid-cooled cold plates of the multiple liquid-cooled cold plates can be increased, and if so, redefining a location of at least one of the outlet and the inlet for the at least two series-connected liquid-cooled cold plates to maximize a path length for a coolant-carrying tube interconnecting the outlet and the inlet of the at least two series-connected liquid-cooled cold plates while maintaining any predefined constraints on the location of the outlet and the inlet for the at least two series-connected liquid-cooled cold plates.

16. The method of claim 11, wherein the reconfiguring further includes identifying at least one tube of the coolant-carrying tube layout having high stress by examining tilt of at least one liquid-cooled cold plate during the simplified three-dimensional numerical analysis of stress and strain, and for at least one liquid-cooled cold plate having tilt, identifying the at least one tube associated with a highest corner thereof as the at least one tube having high stress.

17. A method of configuring a cooling subassembly for an electronics system, the method comprising:

ascertaining a configuration of an electronics system, the electronics system comprising a preconfigured supporting motherboard and a plurality of heat-generating electronic components to be cooled, the plurality of heat-generating electronic components to be cooled being electrically pluggable into corresponding sockets on the preconfigured motherboard;

obtaining an available actuation load for plugging the plurality of heat-generating electronic components into the corresponding sockets of the motherboard and a required final load of each electrical connection of the plurality of heat-generating electronic components into the motherboard; and providing a cooling subassembly employing the ascertained configuration of the electronics system, the cooling subassembly comprising a plurality of liquid-cooled cold plates, the providing including:

laying out at least one cooling subassembly, the at least one cooling subassembly comprising at least two liquid-cooled cold plates of the plurality of liquid-cooled cold plates coupled in series-fluid communication for cooling at least two heat-generating electronic components of the plurality of heat-generating electronic components, the at least two liquid-cooled cold plates being coupled in series-fluid communication employing at least one rigid tube, wherein the laying out comprises:

selecting a configuration for the at least one rigid tube; and employing the ascertained available actuation load and required final load on each electrical connection to determine if loss of actuation load on a heat-generating electronic component to be cooled by one of the at least two liquid-cooled cold plates coupled in series-fluid communication employing the selected configuration for the at least one rigid tube is below an acceptable threshold, and if so, employing the selected configuration for the at least one rigid tube in the at least one cooling subassembly, otherwise, reconfiguring the at least one rigid tube to reduce reactionary force resulting therefrom on at least one liquid-cooled cold plate of the at least two liquid-cooled cold plates coupled in series-fluid communication, said reconfiguring being repeated until loss of actuation load on the at least one liquid-cooled cold plate of the at least two liquid-cooled cold plates coupled in series-fluid communication is below the acceptable threshold.

18. The method of claim 17, wherein the employing further comprises performing three-dimensional numerical analysis of stress and strain on the cooling subassembly and the multiple heat-generating electronic components, including employing the available actuation load on the cooling subassembly to evaluate electrical connection loading of the multiple heat-generating electronic components and the supporting motherboard into which the multiple heat-generating electronic components plug.

19. The method of claim 17, wherein the reconfiguring comprises for the at least one rigid tube, introducing at least one horizontal bend into the at least one rigid tube, lengthening a tube portion in torsion of the at least one rigid tube, or lengthening a tube portion in bending of the at least one rigid tube.

20. The method of claim 17, wherein the laying out further comprises performing computational fluid dynamics analysis on the cooling subassembly to determine if pressure drop and flow distribution are acceptable through the cooling subassembly prior to finalizing design of the cooling subassembly, and wherein the method further comprises reconfiguring the at least one rigid tube if pressure drop or flow distribution through the cooling subassembly is unacceptable, the reconfiguring including at least one of reducing a number of bends in the at least one rigid tube or reducing a length of the at least one rigid tube.

* * * * *